United States Patent
Park et al.

(10) Patent No.: US 7,561,471 B2
(45) Date of Patent: Jul. 14, 2009

(54) CYCLING IMPROVEMENT USING HIGHER ERASE BIAS

(75) Inventors: Sheung-Hee Park, Pleasanton, CA (US); Xuguang Wang, Sunnyvale, CA (US); Wing Leung, Palo Alto, CA (US); Ming-Sang Kwan, San Leandro, CA (US); Yi He, Fremont, CA (US); Edward Franklin Runnion, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 157 days.

(21) Appl. No.: 11/724,711

(22) Filed: Mar. 16, 2007

(65) Prior Publication Data
US 2008/0151644 A1 Jun. 26, 2008

Related U.S. Application Data

(60) Provisional application No. 60/877,192, filed on Dec. 26, 2006.

(51) Int. Cl.
*G11C 16/16* (2006.01)

(52) U.S. Cl. ............... 365/185.19; 365/185.18; 365/185.33; 365/185.29; 365/185.03

(58) Field of Classification Search ............ 365/185.33, 365/185.29, 185.03, 185.19, 185.18
See application file for complete search history.

(56) References Cited

U.S. PATENT DOCUMENTS

| | | | | |
|---|---|---|---|---|
| 6,480,929 | B1 * | 11/2002 | Gauthier et al. | 711/105 |
| 6,965,524 | B2 * | 11/2005 | Choi | 365/185.08 |
| 7,075,828 | B2 | 7/2006 | Lue et al. | |
| 2005/0232009 | A1 * | 10/2005 | Nakamura | 365/185.08 |

\* cited by examiner

*Primary Examiner*—Andrew Q Tran
(74) *Attorney, Agent, or Firm*—Eschweiler & Associates, LLC

(57) ABSTRACT

Methods of erasing flash memory cells are provided that improve erase cycling speed and reliability. One embodiment comprises interactively applying a stepped or ramped drain voltage pattern to a drain of the memory cells and a pulsed gate voltage pattern to a gate of the memory cells for a predetermined number of gate pulses or until all the memory cells are erased. In another embodiment, an erase bias circuit is provided for erasing a sector of flash memory cells, the circuit comprising row and column decoders that selects wordline rows and columns of cells, respectively, a supply bias arrangement that provides source and drain supply voltages for the sector, and a patterned pulse bias arrangement configured to provide a pulsed gate voltage pattern to gates of the cells selected by the row decoder and a drain voltage pattern to the drains of the cells selected by the column decoder.

34 Claims, 15 Drawing Sheets

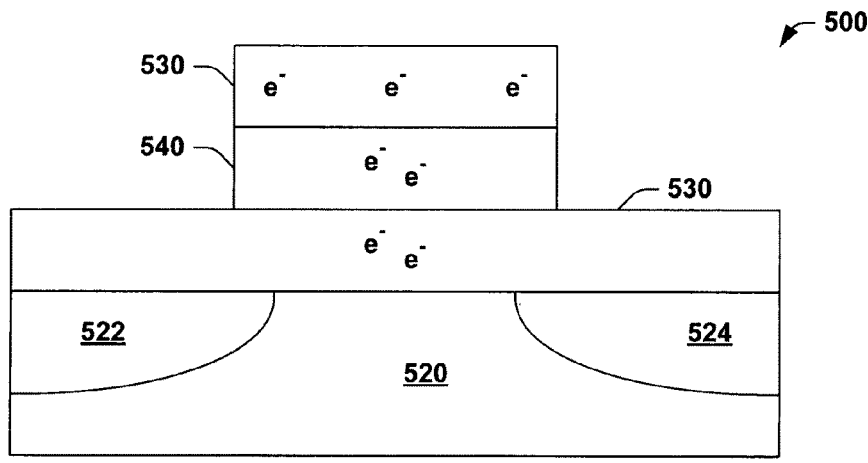
Fig. 5A   MIDDLE OF CHANNEL
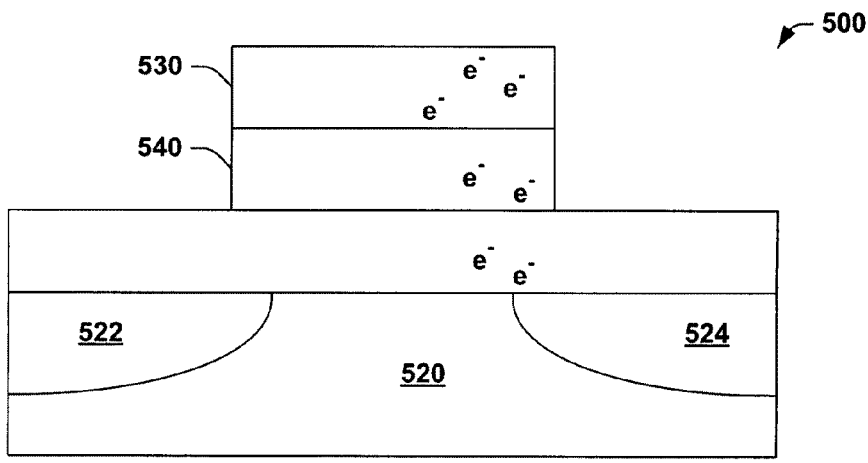
Fig. 5B   EDGE OF CHANNEL
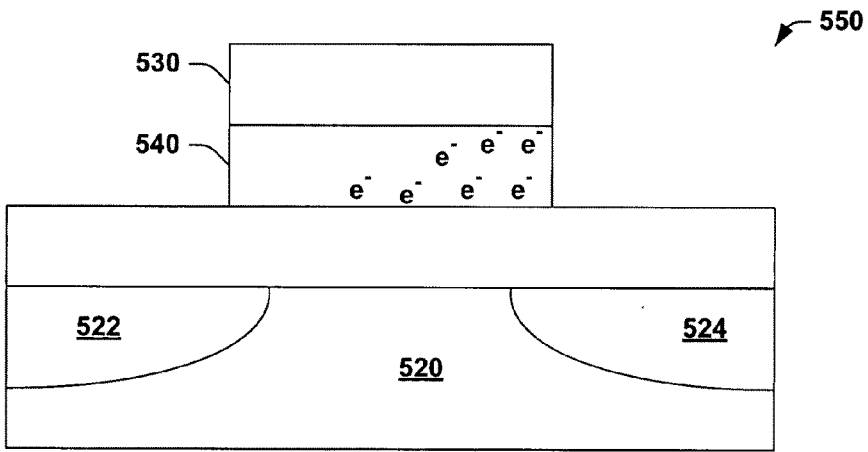
Fig. 5C   HOT HOLE CANNOT REACH THE ELECTRONS

CYCLING IMPROVEMENT USING HIGHER ERASE BIAS

REFERENCE TO RELATED APPLICATION

This application claims priority to and the benefit of U.S. Provisional Application Ser. No. 60/877,192 which was filed Dec. 26, 2006, entitled CYCLING IMPROVEMENT USING HIGHER ERASE BIAS, the entirety of which is hereby incorporated by reference as if fully set forth herein.

FIELD OF INVENTION

The present invention relates generally to memory devices and the like, and in particular to a method of improving erase speed and reliability in flash memory cells having single or multi-level data states.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual-bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks ease of erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc. as well as in many larger electronic systems, such as cars, planes, industrial control systems, etc.

Flash memory is generally constructed of many memory cells where, generally, single bits of data are stored in and read from respective memory cells. The cells are generally programmed by hot electron injection and erased by Fowler-Nordheim tunneling or other mechanisms. As with many aspects of the semiconductor industry, there is a continuing desire and effort to achieve higher device packing densities and increase the number of memory cells on a semiconductor wafer. Similarly, increased device speed and performance are also desired to allow more data to be stored on smaller memory devices.

Individual flash memory cells are organized into individually addressable units or groups, which are accessed for read, program, or erase operations through address decoding circuitry. The individual memory cells are typically comprised of a semiconductor structure adapted for storing a bit of data and includes appropriate decoding and group selection circuitry, as well as circuitry to provide voltages to the cells being operated upon.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

Programming circuitry controls a bit of a cell by applying a signal to a wordline, which acts as a control gate, and changing bitline connections such that the bit is stored by the source and drain connections. Erasing is performed as a blanket operation wherein an array or sector of cells can be simultaneously erased and typically produces a lower threshold voltage in the cell.

After a number of program and erase cycles of a flash memory, a concentration of electrons tend to accumulate in the charge trapping structure, which interferes with the ability to achieve a low threshold state, and limits the endurance and reliability of the device. Band-to-band tunneling induced hot hole injection can be used to erase cells. However, erasing by the hot hole injection may cause oxide damage, leading to charge loss in the higher threshold cells and charge gain in the lower threshold cells. Moreover, the erase time must be increased gradually during program and erase cycling (cycling) due to the hard to erase accumulations of electrons in the charge trapping structure. This accumulation of charge may occur because the hole injection point and electron injection point do not coincide with each other, and some electrons remain after the erase pulse. Thus, the total amount of time required to erase a sector of memory also increases with program and erase cycling.

In addition, during the sector erase of a flash memory device, the erase speed for each cell is different because of process variations (such as channel length variation). This difference in erase speeds results in a large Vt distribution of the erase state and the threshold voltage level of the erased sector. Because of this increasing Vt distribution of the erase state, some cells become harder to erase while some become over-erased. Thus, over continued cycling, a target threshold voltage Vt becomes more difficult to achieve, and poor endurance or reliability is observed.

Regardless of the flash architecture employed, reliably and accurately programming or erasing flash memory cells, and in particular dual sided ONO flash and multi-level flash cells can be particularly sensitive with the attendant complications of maintaining narrow Vt distributions in order to accurately read and determine a data state from a corresponding Vt level. In addition, even if such narrow distributions are attained for the various multiple levels, unless sectors of memory cells can be programmed and erased to within the acceptable limits quickly, efficiently, and reliably, little competitive advantage may be gained.

In view of the foregoing, a need exists for an improved method of quickly and efficiently erasing a sector or array of the various types of flash memory cells, in a manner that maintains a high reliability and narrow Vt distribution of the erased bits over extended program and erase cycling of the device.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention quickly and reliably erases a sector or a wordline of flash memory bits using a patterned pulse erase bias arrangement for obtaining high erase bias levels that improve erase cycling speed and reliability while maintaining highly compact Vt distributions. The gate voltage Vg and the drain voltage Vd each follow a predetermined pattern generated by the patterned pulse erase bias arrangement and are applied to the gates (wordline) and drains, respectively, of the cells. The gate voltage pattern comprises a series of gate voltage pulses having one or more levels, wherein the levels may be increased over time to insure the cells are all erased. The drain voltage pattern comprises, for example, a stepped or ramped drain voltage, wherein the voltage level may be increased over time to further insure all the cells are erased.

In operation, the predetermined gate and drain voltage patterns are applied to, for example, the flash cells along the wordline (WL) or an entire sector of flash memory cells. The drain voltage pattern is initialized at a start Vd level (e.g., about 5.5 volts) and the gate voltage pattern starts by pulsing the gate at a start Vg pulse amplitude (e.g., about −5.5 volts). The method of the present invention then checks to determine if all the cells of the sector, for example, are erased. If all the cells are not erased, the gate pulsing continues along or according to the predetermined gate voltage pattern until a maximum pulse count is achieved or all the cells are erased. If the maximum pulse count achieved, the drain voltage is then stepped up or ramped up, for example, along or according to the predetermined drain voltage pattern. The gate pulsing then continues at this new drain voltage level until the maximum gate pulse count is achieved or all the cells are erased.

Gate pulsing and drain voltage continue and continue increasing in this way according to the predetermined patterns until a predetermined maximum gate voltage Vgmax (e.g., about −8.0 volts) and maximum drain voltage Vdmax (e.g., about 6.5 volts, or about 0.3V less than the breakdown voltage $V_{BD}$) is achieved or until all the cells are erased.

Thus, erasing continues until accomplished according to a predetermined Vd and Vg profile of successive erase pulses (e.g., about 50-200 mV step per erase pulse of about 150 ns-2 μs pulse width) applied to the memory cells. In this way, the cells of each wordline are more finely erased to a data state that achieves a more precisely targeted Vt level and Vt distribution.

The flash memory cells which may be utilized may have two or more data levels or data states which include a blank level or erased state and two or more programmed levels. In addition, the method of the present invention is applicable to cells having one or more physical bits per cell, for example, a dual sided ONO flash cell. The dual sided ONO flash cell has two physical bits or complementary bits per cell that may be programmed or erased to the same program or erase pattern or multiple patterns may be selected along a wordline.

A multi-level bit (MLB) flash memory cell may also be used in accordance with the present invention, and may comprise a single physical bit that can be programmed to three or more levels corresponding to three or more data states. Alternately, the MLB cell may comprise a dual sided ONO flash or mirror-bit cell having two physically distinct bits that may each be programmed to multiple levels such as four, wherein 16 possible states are then available. The method may be suitably implemented in a variety of flash memory architectures including single and dual sided ONO flash EEPROM, and other such single or multi-bit memory architectures that may be electrically programmed and erased, and any such cell or variant is contemplated as falling within the scope of the present invention.

In another aspect of the present invention, the predetermined drain voltage pattern may comprise a stepped voltage pattern. In still another aspect of the invention, the predetermined drain voltage pattern may comprise a ramped voltage pattern.

In yet another aspect of the invention, either the drain voltage or the gate voltage is held constant while the other of the voltages follows the predetermined voltage pattern.

In another aspect of the present invention, the predetermined gate voltage pattern comprises a series of pulses wherein the amplitude of the pulses increases in a stepped voltage pattern.

In still another aspect of the present invention, the predetermined gate voltage pattern comprises a series of pulses wherein the amplitude of the pulses increases in a stepped voltage pattern synchronized with the drain voltage pattern.

In another aspect of the present invention, the stepped drain voltage pattern increases to an incrementally greater drain voltage by about 0.1 volt per step of the stepped drain voltage pattern.

In still another aspect of the present invention, the maximum drain voltage is about 0.3 volts lower than the breakdown voltage $V_{BD}$ of the flash memory cells, also represented as Vmax=about $V_{BD}$−0.3V.

In yet another aspect of the present invention, the predetermined gate voltage pattern comprises a predetermined number of pulses for each step of the stepped drain voltage pattern.

The present invention provides a method of erasing a wordline or a sector of an array of flash memory cells that yields a well controlled narrow Vt distribution using minimal erase time, while maintaining high reliability.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIGS. 5A, 5B, and 5C are cross-sectional views of a floating gate flash memory cell wherein several models are proposed which attempt to explain the mechanism of apparent electron build-up and/or increased Vt of the flash memory cells such as may be addressed in accordance with several aspects of the present invention.

DETAILED DESCRIPTION OF THE INVENTION

Figure 1:
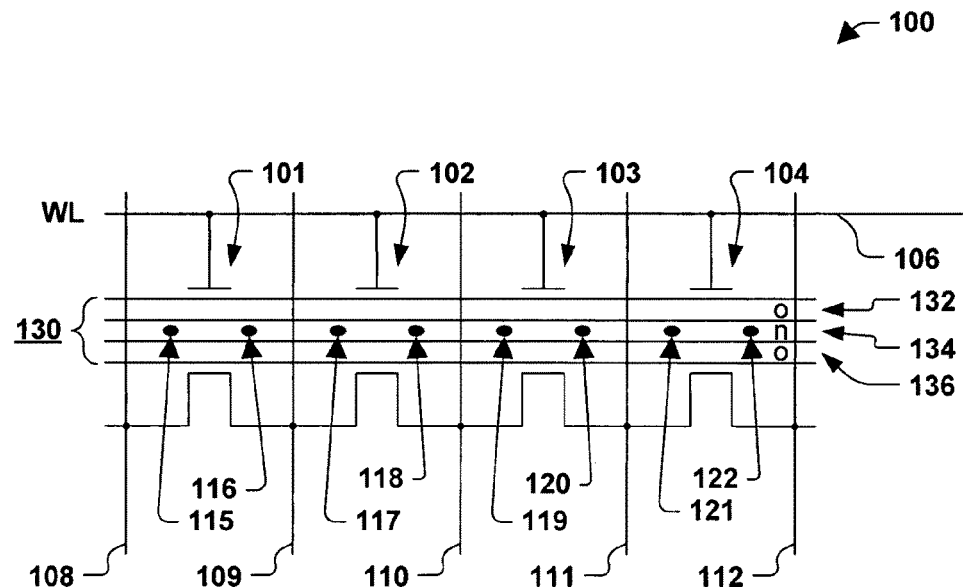
FIG. 1 is a schematic illustration of a portion of a wordline of dual sided ONO flash memory cells.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

The present invention discloses a patterned pulse erase bias arrangement and method for quickly and reliably erasing a sector or a wordline of flash memory bits that improve erase cycling speed and reliability while maintaining highly compact Vt distributions. The patterned pulse erase bias arrangement provides a high bias level as a patterned gate voltage Vg applied to the gates (wordline), and a patterned drain voltage Vd applied to the drains of the cells. The high bias level voltages of the patterns follow a predetermined pattern generated by the patterned pulse erase bias arrangement. The gate voltage pattern comprises a series of gate voltage pulses having one or more levels, wherein the levels may be increased over time to insure the cells are all erased. The drain voltage pattern comprises, for example, a stepped or ramped drain voltage, wherein the voltage level may be increased over time to further insure all the cells are erased.

Programming circuitry controls a bit of a cell by applying a signal to a wordline, which acts as a control gate, and changing bitline connections such that the bit is stored by the source and drain connections. Programming a cell using a suitable mechanism such as hot electron injection, generally increases the threshold voltage of a cell. In operation, individual flash cells are addressed via the respective bitline and wordline using a peripheral decoder and control circuitry for programming (writing), reading or erasing functions. Erasing is performed as a blanket operation wherein an array or sector of cells can be simultaneously erased and typically produces a lower threshold voltage in the cell.

By way of further detail, a single bit flash memory cell may be programmed by a suitable mechanism, such as hot electron injection. Programming with hot-electron injection involves applying a relatively high voltage to the control gate and connecting the source to ground and the drain to a predetermined potential above the source. When a resulting electric field is high enough, electrons collect enough energy to be injected from the source onto the nitride layer of the ONO flash. As a result of the trapped electrons, the threshold voltage of the cell increases. This change in the threshold voltage (and thereby the channel conductance) of the cell created by the trapped electrons is what causes the cell to be programmed.

As with many aspects of the semiconductor industry, there is a continuing desire to scale down device dimensions to achieve higher device packing densities on semiconductor wafers. Similarly, increased device speed and performance are also desired to allow more data to be stored on smaller memory devices. Accordingly, there are ongoing efforts to, among other things, increase the number of memory cells that can be packed on a semiconductor wafer (or die).

For example, another type of flash memory is dual sided ONO flash memory, which allows multiple bits to be stored in a single cell. In this technology, a memory cell is essentially split into two identical (mirrored) or complementary regions, each of which is formulated for storing one of two independent bits. Each dual sided ONO flash memory cell, like a traditional cell, has a gate, a source, and a drain. However, unlike a traditional stacked gate cell in which the source is always connected to an electrical source and the drain is always connected to an electrical drain, respective dual sided ONO flash memory cells can have the connections of the source and drain reversed during operation to permit the storing of two bits.

In a virtual ground type architecture, dual sided ONO flash memory cells have a semiconductor substrate with conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Erase and programming circuitry controls two bits per cell by applying a signal to the wordline, which acts as a control gate, and changing bitline connections such that one bit is stored by the source and drain being connected in one arrangement and a complementary bit is stored by the source and drain being connected in another arrangement.

The closeness of such dual sided ONO flash architectures, however, also causes certain undesirable phenomena to become prevalent. For example, isolating two bits or charges stored within a charge trapping layer becomes increasingly difficult as the channel length is decreased and the bits are brought closer together. In this manner, the charge on the bits can contaminate or disturb one another, causing operations performed on the bits to be more challenging and introducing a greater opportunity for error. This interdependency or the affect that bits can have on one another is sometimes referred to as complementary bit disturb or CBD.

As has been previously mentioned, over time and as program erase cycling continues, it has been discovered that some cells become harder to erase while others become over erased. One theory holds that this is because charge may tend to build up in the charge trapping structures, thereby raising the threshold voltage Vt of the erased state. As a result, the total amount of time required to erase a sector of memory may also tend to increase. In addition, during the sector erase of a flash memory device, the erase speed for each cell is different, in part, because of process variations (such as channel length variation). This difference in erase speeds, along with other processes which will be discussed, result in a large Vt distribution of the erase state and the threshold voltage level of the erased sector. Thus, over continued cycling, a target threshold voltage Vt becomes more difficult to achieve, and poor endurance or reliability is observed.

Erase speed and reliability are major considerations in the flash memory fabrication and the marketability of such memory devices. Accordingly, the inventors of the present invention have appreciated and discovered that a higher erase bias may be used to speed the erase operations and also improve flash cell reliability. In particular, the inventors of the present invention have shown that the erase methods of the present invention utilizing a higher pulsed erase gate voltage Vg pattern and a higher drain voltage Vd pattern may be used interactively to rapidly erase all the cells while providing a more consistence Vt distribution and higher reliability product.

Some flash memory devices tend to be more sensitive to such program and erase cycling effects, for example, multi-level cell technologies, and the closely spaced complimentary bit type devices, which present many new problems attempting to maintain well controlled or tight distributions of the Vt levels, particularly as larger data bit quantities are considered. Thus, the present invention may find greatest benefit in these and other select flash memory technologies. Such device requirements and issues are likely to increase as device features continue to shrink and the density of memory cells increases.

Accordingly, it is a goal of the present invention to provide a method of erasing a sector or wordline of an array of suitable flash memory cells, which achieves the aforementioned requirements while also providing improved Vt program distributions, levels of speed, endurance, and reliability.

As the patterns of gate and drain voltages are applied to the cells, the bits become increasingly erased to a final target Vt (e.g., a lower Vt) corresponding to a erased data state of the bits. It will further be appreciated that the erased bits may be deselected from the wordline to prevent over-erasure. Preferably, the algorithm of the method selects the gate and drain voltage erase profile which is most beneficial for a particular technology flash device, for example, to minimize the CBD for the bit-pair erase pattern initially selected for the wordline. The algorithm achieves well controlled compact Vt distributions compared to those of some conventional fixed voltage erase methods. The method may be suitably implemented in a variety of flash memory architectures including single and dual sided ONO flash EEPROM, and other such single and multi-bit memory architectures that may be electrically programmed, and any such cell or variant is contemplated as falling within the scope of the present invention. These concepts will be further appreciated in the context and more detailed discussions of the following figures.

Referring initially to FIG. 1, a schematic illustration is presented of a portion of a wordline of dual sided ONO flash core memory cells 100 such as may be included in at least part of an array of, for example, multi-level flash memory cells. The circuit schematic shows a group of memory cells 101 through 104 in a virtual ground type implementation, for example. The respective memory cells 101 through 104 are connected to a wordline 106, which serves as a control gate, and pairs of the memory cells share a common bitline. For instance, in the example shown, the memory cell 101 has associated bitlines 108 and 109; the memory cell 102 has associated bitlines 109 and 110; the memory cell 103 has associated bitlines 110 and 111; and the memory cell 104 has associated bitlines 111 and 112. As such, cells 101 and 102 share bitline 109, cells 102 and 103 share bitline 110 and cells 103 and 104 share bitline 111, respectively.

Depending upon wordline voltages and bitline connections, the memory cells 101 through 104 are capable of writing, reading, and erasing bits at locations 115 through 122. In addition to voltages applied to the wordline 106, reading the bit (e.g., "A" bit of cell 101) at location 115, for example, is achieved through connection of the drain to the bitline 109 and the source to the bitline 108. Similarly, reading the bit (e.g., "B" bit of cell 101) at location 116 is achieved through connection of the drain to the bitline 108 and the source to the bitline 109. Storage of multiple bits is made possible, at least in part, by a charge trapping dielectric layer 130 interposed between the bitlines and the wordline. The charge trapping dielectric layer 130 includes multiple insulating layers 132, 136 (e.g., of oxide based material) that sandwich a charge trapping layer 134 (e.g., of nitride based material). Given its layer to layer composition, the charge trapping dielectric layer 130 is often referred to as an ONO layer (for the oxide, nitride, oxide layers).

The ONO layer 130 allows the different bits to be stored at multiple states or levels as well. For example, depending upon the voltage applied to the memory cells 101 through 104 by the control gate or wordline 106 during programming, varying amounts of charge can be stored at locations 115 through 122. The different amounts of charge may correspond to different bit states or levels, for example. If four different charge levels or data levels (e.g., 1, 2, 3 and 4) can be stored at each of the bit locations 115 through 122, for example, then each two-bit cell 101 through 104 can have 16 different combinations of stored data (e.g., 1-1, 1-2, 1-3, 1-4, 2-1, 2-2, 2-3, 2-4, 3-1, 3-2, 3-3, 3-4, 4-1, 4-2, 4-3 and 4-4).

Figure 2:
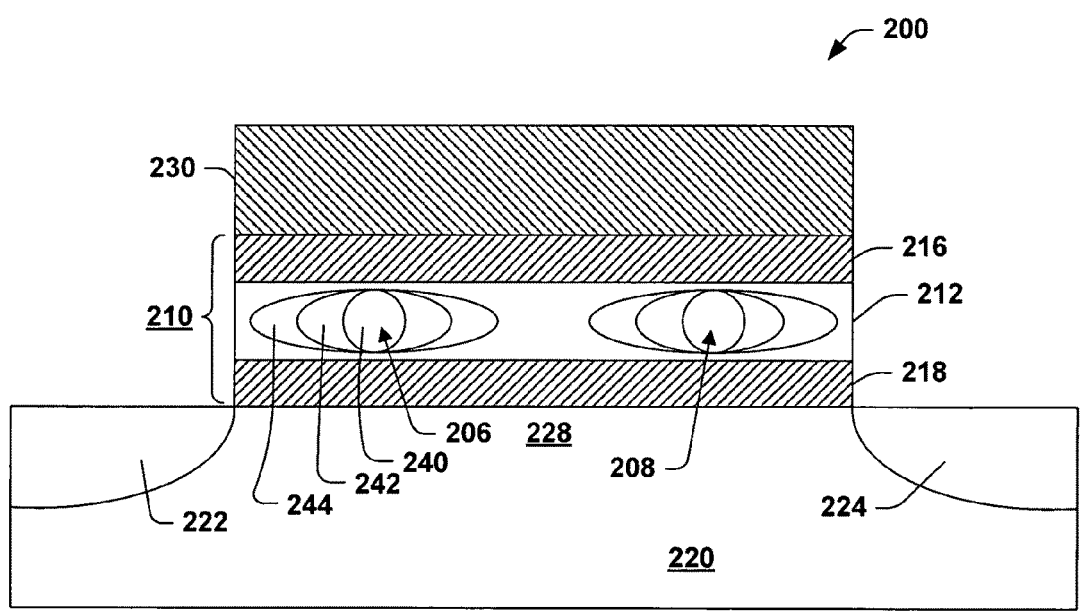
FIG. 2 is a cross-sectional view of a dual sided ONO flash memory cell wherein each of the bits can be stored at multiple levels.

FIG. 2 is a cross sectional view of a dual sided ONO flash memory cell 200 illustrating the capability of the cell to store varying degrees of charge at bit locations 206 and 208. It will be appreciated that the memory cell 200 may, for example, correspond to the memory cells 101 through 104 depicted in FIG. 1. The cell 200 includes a charge trapping dielectric layer (ONO layer) 210 that comprises a charge trapping layer 212 sandwiched between two dielectric layers 216, 218. The charge trapping layer 212 is formed from one or more substantially non-conductive substances, such as nitride based materials. The dielectric layers 216, 218 are similarly formed from one or more electrically insulating substances, such as oxide based materials.

The charge trapping ONO layer 210 is formed over a substrate 220 that may be formed from silicon or some other semiconductor material, for example. The substrate 220 may be selectively doped with a p-type dopant, such as boron, for example, to alter its electrical properties. In the example illustrated, the substrate 220 has buried bitlines or bitline diffusions including a first bitline diffusion 222 and a second bitline diffusion 224. The bitline diffusions 222 and 224 may, for example, be formed by an implanted n-type dopant, and may correspond to bitlines 108 through 112 in FIG. 1. A channel 228 is defined within the substrate between the first 222 and second 224 bitline diffusions (e.g., S/D extensions, deep S/D regions).

Overlying the upper dielectric layer 216 of the ONO layer 210 is a gate 230. This gate 230 may be formed from a polysilicon material, for example, and may be doped with an n-type impurity (e.g., phosphorus) to alter its electrical behavior. The gate 230 may, for example, correspond to the wordlines 106 in FIG. 1. The gate 230 enables a voltage to be applied to the cell 230 such that respective charges can, among other things, be stored within the cell at locations 206, 208, depending upon the electrical connections of the bitline diffusions 222, 224.

The dual sided ONO flash memory cell 200 is generally symmetrical, thus the bitline diffusions 222 and 224 are interchangeable as acting source and drain. Thus, the first bitline diffusion 222 may serve as the source and the second bitline diffusion 224 as the drain with respect to right bit location 208 for programming. Likewise, the second bitline diffusion 224 may serve as the source and the first bitline diffusion 222 as the drain for the left bit location 206 for programming. The cell 200 can be programmed by applying a voltage across the gate 230 and an acting drain region, and connecting an acting source region to ground.

When programming the cell 200, the acting drain region is typically biased to a potential above the acting source. As a result of the gate bias, a high electric field is applied across the charge trapping layer 212. Due to a phenomenon known as "hot electron injection", electrons pass from the acting source region through the lower dielectric layer 218 and become trapped in the charge trapping layer 212 at locations 206 or 208. It will be appreciated that a second bit can be programmed to the alternate location 208 or 206 by reversing the acting source and drain and again applying a bias to the control gate 230.

By way of example, the left bit location 206 can be programmed by applying a program voltage to the gate 230 and a drain voltage to the second bitline 222, which is an acting drain for the left location 206. The first bitline 224, which is an acting source for programming the left bit location 206, can be connected to ground, or biased to a different voltage level. The applied voltages generate a vertical electric field through the dielectric layers 218 and 216 and also through the charge trapping layer 212, and generate a lateral electric field across a length of the channel 228 from the first bitline diffusion 222 to the second bitline diffusion 224. At a given voltage, the channel 228 inverts such that electrons are drawn off the acting source (the first bitline diffusion 224 in this example) and begin accelerating towards the acting drain (the second bitline diffusion 222 in this example).

As the electrons move along the length of the channel 228, the electrons gain energy and, upon attaining enough energy, the electrons jump over the potential barrier of the bottom dielectric layer 218 and into the charge trapping layer 212, where the electrons become trapped. The probability of electrons jumping the potential barrier in this arrangement is a maximum in the area of the left bit location 206, adjacent the first bitline diffusion 222, where the electrons have gained the most energy. These accelerated electrons are termed hot electrons and, once injected into the charge trapping layer 212, stay in about the general area indicated for the left bit. The trapped electrons tend to remain generally localized due to the low conductivity of the charge trapping layer 212 and the low lateral electric field therein. Programming the right bit location 208 is similar, but the first bitline 224 operates as an acting drain and the second 222 operates as an acting source.

For a read operation, a certain voltage bias is applied across an acting drain to an acting source of the cell 200. The acting drain of the cell is a bitline, which may be connected to the drains of other cells in a byte or word group. A voltage is then applied to the gate 230 (e.g., the wordline) of the memory cell 200 in order to cause a current to flow from the acting drain to the acting source. The resulting current is measured, by which a determination is made as to the value of the data stored in the cell. For example, if the current is above a certain threshold, the bit is deemed unprogrammed or a logical one, whereas if the current is below a certain threshold, the bit is deemed to be programmed or a logical zero. A second bit can be read by reversing operations of the first and second bitline diffusions 222 and 224 for the acting drain and the acting source.

It can be appreciated that if the voltages utilized to program the left 206 and right 208 bit locations of the cell 200 are increased or sustained for longer periods of time, the number of electrons or amount of charge stored at these locations can be increased or otherwise varied. This allows the cell 200 to be utilized for additional data storage. For example, different amounts of charge can correspond to different programmed states. In the example illustrated, for instance, both the left 206 and right 208 bit locations can be said to have four different states or levels, namely 1, 2, 3 and 4, where level 1 (L1) corresponds to a situation where the locations are blank or un-programmed, and levels 2, 3 and 4 (L2, L3, and L4, respectively) correspond to increased amounts of stored charge, respectively. With regard to the left bit location 206, for example, a level 2 may correspond to a relatively small amount of stored charge 240, while levels 3 and 4 may correspond to increasingly larger amounts of stored charge 242 and 244, respectively. As indicated previously, this technique is also called multi-level cell technology, which is useful to increase density and reduce manufacturing costs.

Multi-level cells increase the effective cell density by increasing the number of possible logical states or data states associated with a cell, thereby allowing a single memory cell to store information corresponding to more than one data bit. One way this has been done is by using multiple (three or more, in the context of cell levels and states) threshold voltage (Vt) levels, which correspond to multiple data states per cell. This contrasts to the two states or levels used in conventional flash memory cells. Thus, in the example above, a single dual sided ONO flash cell may store in each of its two physical bits four Vt levels corresponding to four logical states.

Figure 3:
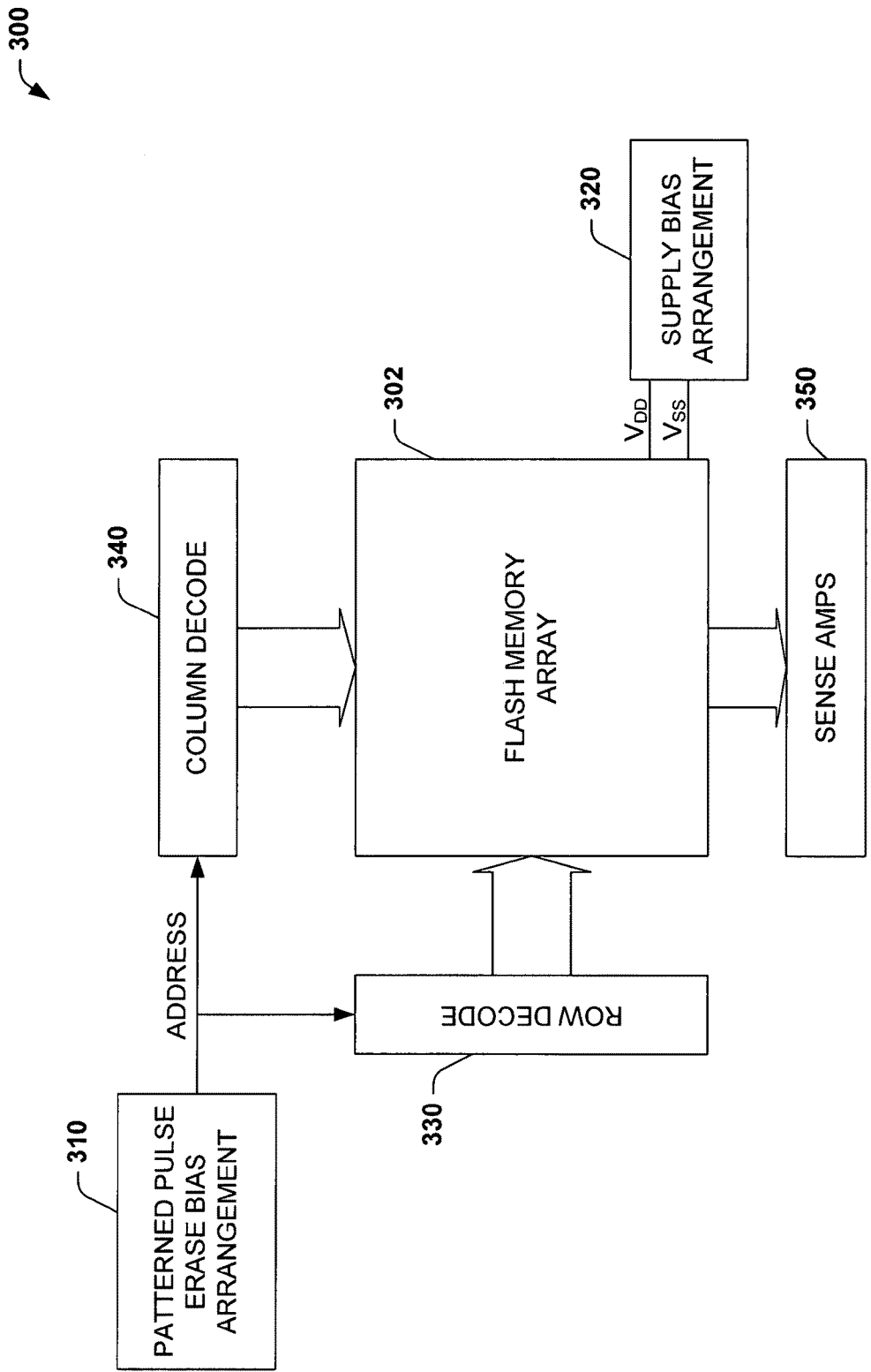
FIG. 3 is a simplified block diagram of an exemplary flash memory device in accordance with an aspect of the present invention and such as may apply to the dual sided ONO flash cell of FIG. 2 and other such flash memory cells.

FIG. 3 illustrates an exemplary flash memory device 300 in accordance with an aspect of the present invention and such as may apply to the dual sided ONO flash cell of FIGS. 1 and 2 and other such flash memory cells.

Flash memory device 300, for example, comprises a flash memory array 302, having a patterned pulse erase bias arrangement 310 and a supply bias arrangement 320. The patterned pulse erase bias arrangement 310 provides a pulsed gate voltage pattern to the wordlines attached to the cell gates of the flash memory array 302 by way of a row address decoder 330, and provides a stepped or ramped drain voltage pattern to the drains of the cells of the flash memory array 302 via a column address decoder 340. Supply bias arrangement 320 supplies a drain voltage $V_{DD}$ to the cell drain terminals and a source voltage $V_{SS}$ to the cell source terminals of the flash memory array 302. Sense amplifiers 350 may be utilized to sense and read the data states of the cells of the array 302 during read operations, for example. The patterned pulse erase bias arrangement 310 may be used in accordance with the method of the present invention and the flash memory device 300 to rapidly and interactively erase all the cells of the memory 302, and provide a more consistent Vt distribution and higher reliability product.

As discussed, flash memory cells 302 may be programmed and erased thousands of times with varying degrees of reliability, due in part to a slowly changing Vt. As will be shown in FIGS. 4A and 4B, the inventors of the present invention have discovered that the erase bias voltages applied to the drain and gate voltages can have differing effects when applied to fresh or uncycled cells as contrasted to those of previously cycled cells.

Figure 4A:
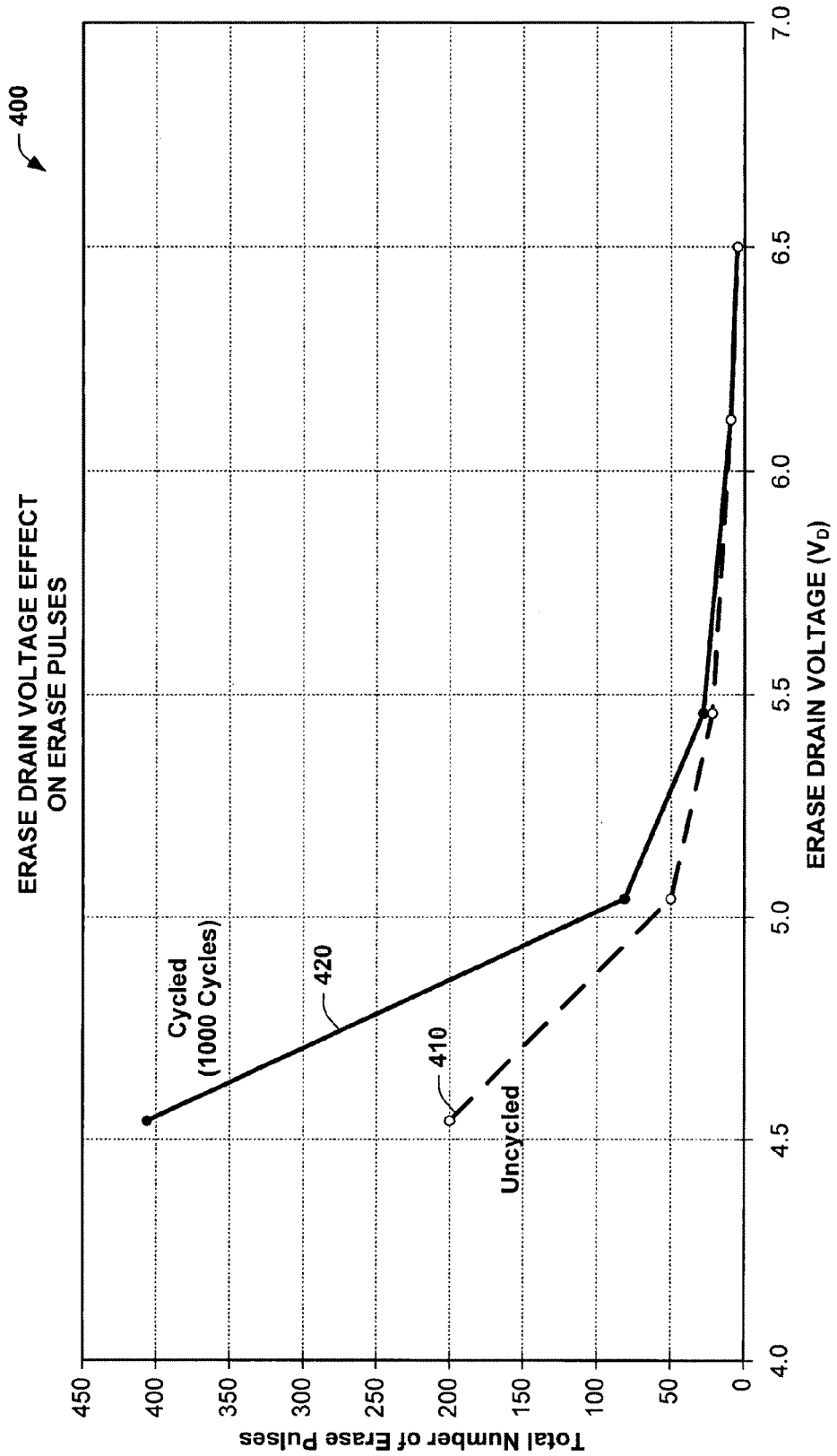
FIG. 4A is a chart illustrating the effect that exemplary drain voltages may have on flash memory cells which have been program and erase cycled 1000 times and on cells which have not been cycled, demonstrating that the number of erase pulses required to erase the cells may decrease dramatically at higher erase drain voltages in accordance the method of the present invention.

FIG. 4A, for example, illustrates a plot 400 of the effect that exemplary drain voltages may have on flash memory cells which have been program and erase cycled, and also on cells which have not been cycled. For example, drain voltage plot 410 illustrates the effect of erasure on fresh cells which have not yet been cycled, while drain voltage plot 420 illustrates the effect of erasure after the flash memory cells have been programmed and erased 1000 times. For example, the uncycled cells of drain voltage plot 410 only require about 200 erase pulses at 4.6 volts, whereas the cells of drain voltage plot 420 which have been cycled 1000 times require about 410 pulses of the same amplitude and duration.

FIG. 4A also demonstrates that the number of erase pulses required for erasing the cells can decrease dramatically at higher drain voltage bias levels in accordance the method of the present invention. For example, both the uncycled cells of drain voltage plot 410 and the cycled cells of drain voltage plot 420 require only about 5 to 8 pulses of the same amplitude and duration to erase the cells when a relatively higher drain voltage bias is used at a drain voltage Vd of about 6.5 volts.

Figure 4B:
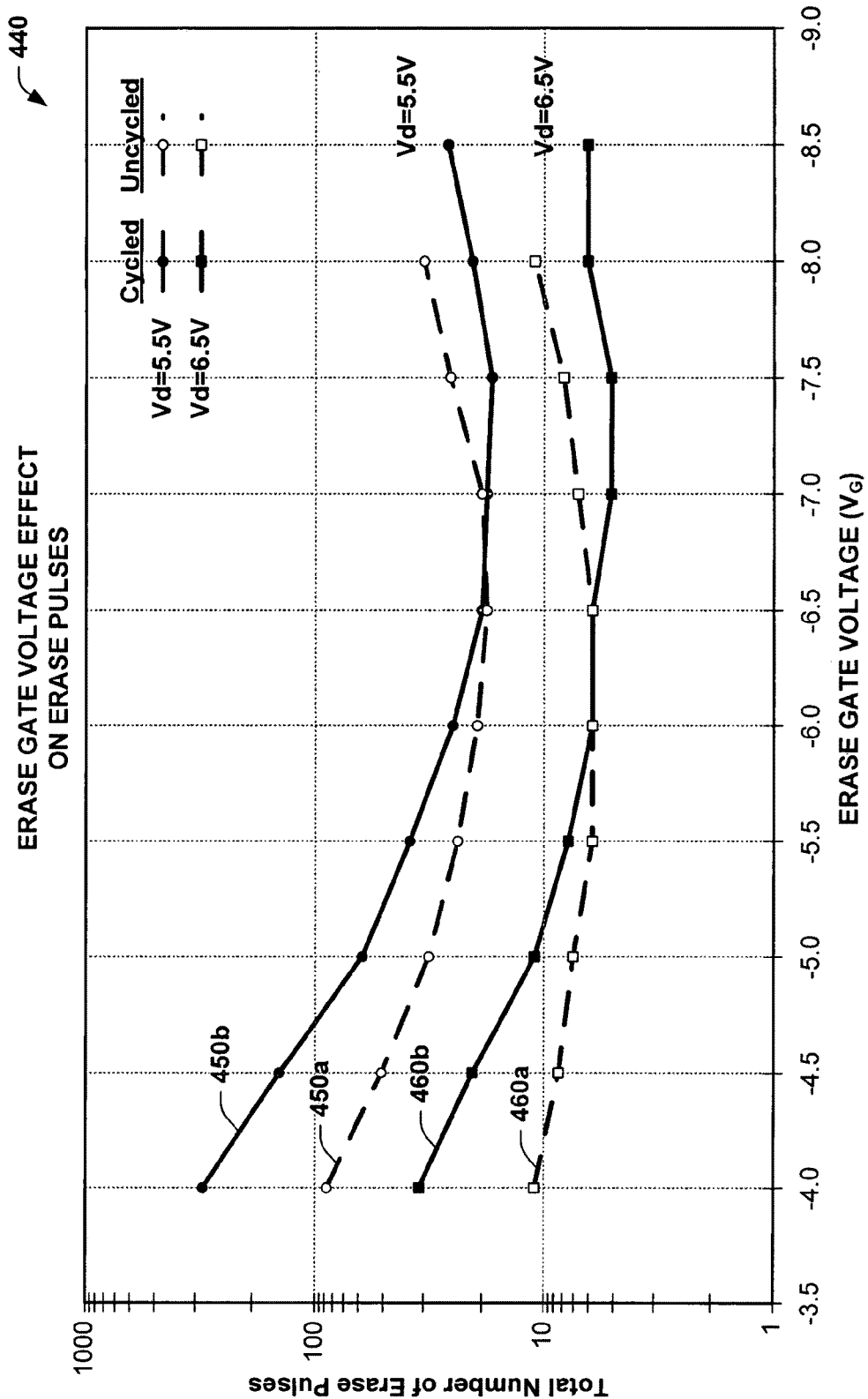
FIG. 4B is a chart illustrating the effect that exemplary erase gate voltages and two drain voltages may have on flash memory cells which have been program and erase cycled 1000 times and on cells which have not been cycled, demonstrating that the number of erase pulses required to erase the cells may decrease dramatically at higher erase gate and drain voltages in accordance the method of the present invention.

FIG. 4B illustrates the effect that exemplary erase gate voltages and two drain voltages may have on flash memory cells which have been program and erase cycled 1000 times, and on cells which have not been cycled in plots. For example, erase gate voltage plots 450a and 460a illustrate the erasure of fresh cells which have not yet been cycled, while erase gate voltage plots 450b and 460b illustrate the effect of erasure after the flash memory cells have been programmed and erased 1000 times. Erase gate voltage plots 450a/b were obtained at a drain voltage of 5.5 volts, while erase gate voltage plots 460a/b were obtained at a drain voltage of 6.5 volts. Thus, once again, the fresh or uncycled cells of plots 450a and 460a erase with fewer erase pulses of the same pulse amplitude and duration than the previously cycled cells of plots 450b and 460b.

FIG. 4B further demonstrates that the number of erase pulses required to erase the cells may decrease dramatically at both the higher erase gate and drain voltages in accordance the method of the present invention. For example, comparing the cycled cells plot 450b at 5.5 volts Vd to that of plot 460b at 6.5 volts Vd, once again, demonstrates that the higher bias erase gate voltage plot 460b at 6.5 volts Vd only requires 5 erase pulses at −7.5 volts Vg, while the lower erase gate voltage plot 450b at 5.5 volts Vd requires about 20 erase pulses at the same −7.5 volts Vg.

FIGS. 5A, 5B, and 5C illustrate a floating gate flash memory cell wherein several models 500, 550 and 570, respectively, are proposed which attempt to explain the mechanism of apparent electron build-up and/or increased Vt of the flash memory cells such as may be erased in accordance with several aspects of the present invention. The flash memory cell illustrated in FIGS. 5A, 5B, and 5C comprises a floating gate transistor having a substrate 520, a source region 522, a drain region 524, and an ONO layer comprising oxide layers 530 above and below a nitride layer 540, forming a channel region between the ONO layer, the substrate 520, and between the source region 522 and the drain region 524.

The inventors of the present invention created and tested several models to explain the apparent electron buildup symptom. FIGS. 5A and 5B illustrate a first model 500 which may be categorized as a "redundant electron injection" model. FIG. 5A of model 500 illustrates the electron positions in the middle of the channel or as FIG. 5B illustrates the electron at the edge of the channel. The mechanism for the model 500 of FIGS. 5A and 5B proposes that; electrons are injected from the poly to the channel region during the erase, wherein these electrons become difficult to remove or compensate. One assumption that was made here is that good wafers have small backside injection. FIG. 5C illustrates a second model 550 which may be characterized as a "stuck electrons" model. The mechanism for the model 550 of FIG. 5C proposes that; over continued cycling, more electrons are spilled into the middle of the channel due to junction differences or a shift of the CHE injection point. These electrons are then difficult to remove by hot holes. The assumption that may be made here is that, good wafers have less problem spilling electrons into the middle of the channel. By intentionally putting electrons into the channel over a period of cycling makes every wafer, including good wafers, into bad wafers. Regardless of the actual mechanism which takes place, the present invention provides a system and method of rapidly and efficiently erasing a sector or word line of flash memory cells in a manner that provides improved reliability and a narrower distribution of the erased threshold voltage Vt.

Figure 6A:
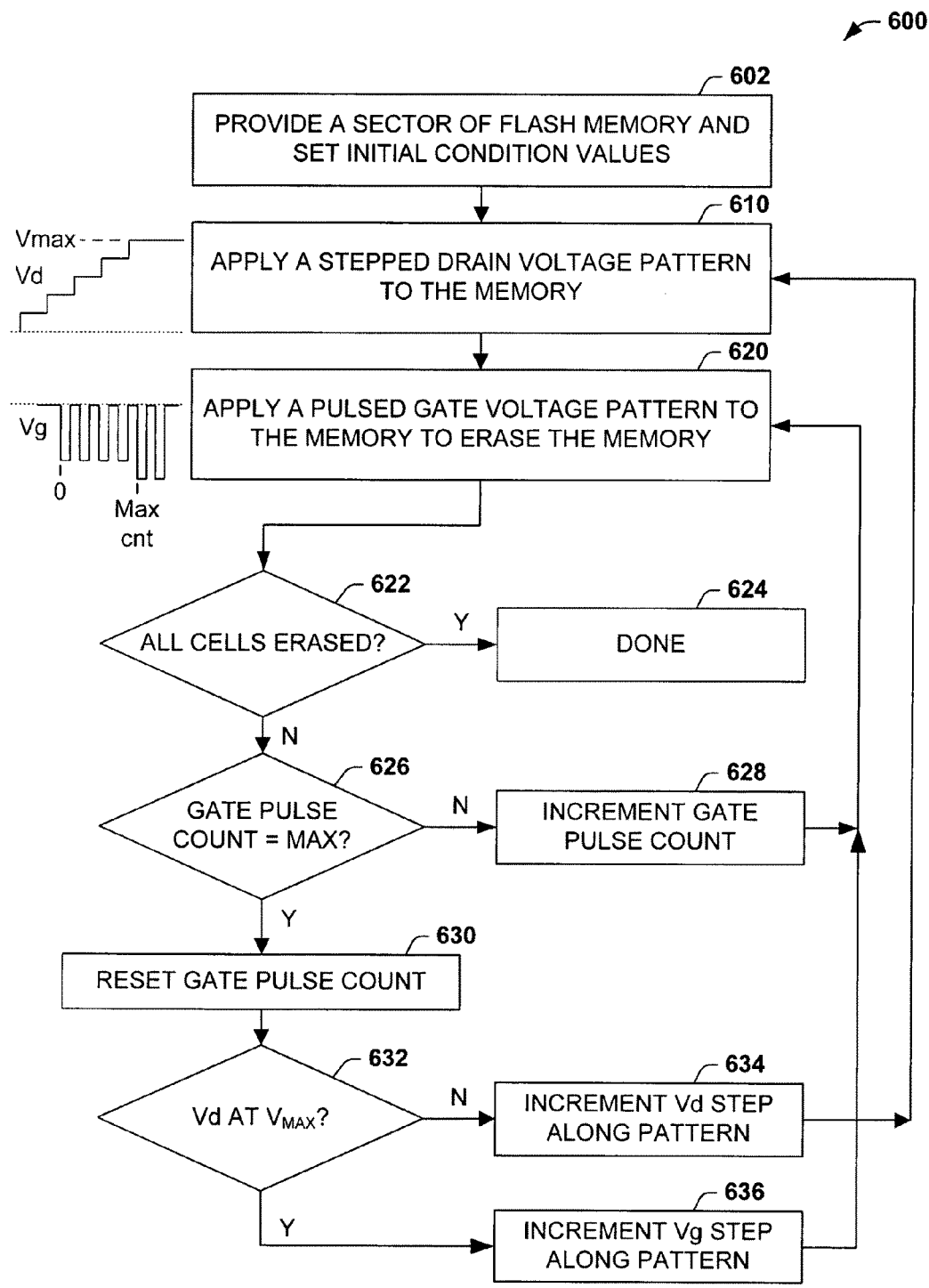
FIGS. 6A and 6B are flow diagrams illustrating exemplary methods of erasing a sector or wordline of flash memory cells, the methods including drain and gate erase voltage patterns for interactively erasing memory cells in accordance with several aspects of the present invention.
Figure 6B:
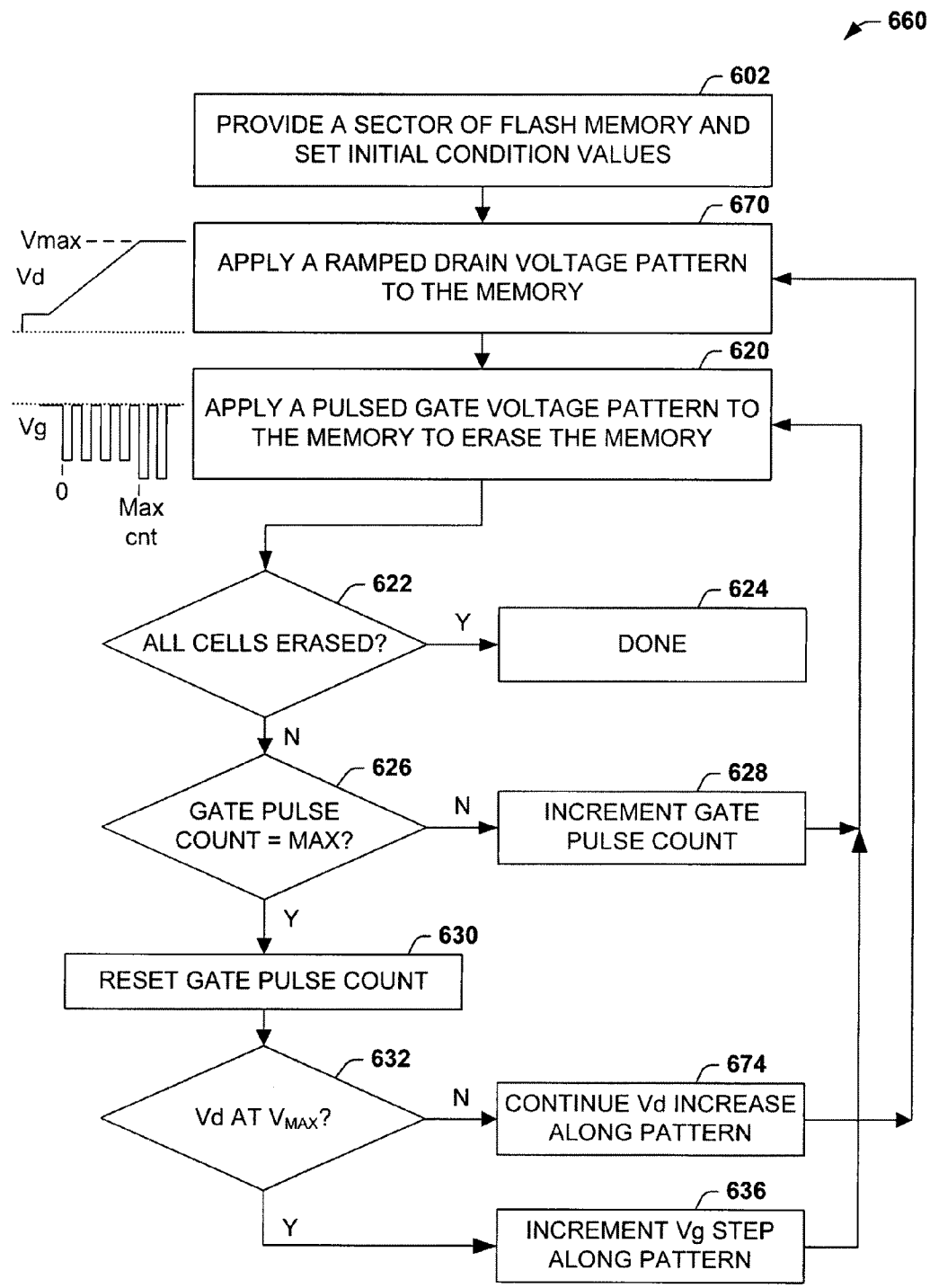

FIGS. 6A and 6B illustrate exemplary methods of erasing a sector or wordline of flash memory cells, the methods including drain and gate erase voltage patterns used to interactively erase memory cells such as that of flash memory device 300 and flash memory array 302 of FIG. 3 in accordance with several aspects of the present invention. The methods of the present invention employ a patterned pulse erase bias arrangement operable to supply the drain and gate erase voltage patterns to the flash memory array 302, and are suitably implemented in many types and technologies of flash memory devices, such as that of the dual-sided ONO multi-level cell 100 of FIGS. 1 and 2. As a result, the methods employed may be faster and yield a more reliable memory device than some other conventional erase methods.

Although the methodology is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

FIG. 6A, for example, illustrates a flow diagram of an exemplary method 600 of erasing a sector or wordline of flash memory cells 302, the method 600 including the use of drain and gate erase voltage patterns (e.g., patterns 700-760 of FIGS. 7A-7E illustrated and described hereinafter) used to interactively erase the memory cells of flash memory array 302 of FIG. 3 in accordance with several aspects of the present invention. In the methods of the present invention, the threshold voltage Vt of the erased state is also known as a blank level or may represent one of the programmed level assignments and Vt distribution polarities of the flash memory cells or bits, and such variations are contemplated as falling with the scope of the present invention. While the term "wordline" or "array" is used throughout, it should be understood that such terms are not to be construed as limiting to one specified grouping of cells or bits, but rather may apply to any grouping of flash memory cells including single or multi-bit cells.

For example, method 600 of FIG. 6A includes a stepped drain voltage pattern and a pulsed gate voltage pattern used to interactively erase memory bits of a sector or wordline in accordance with the present invention. In addition, the exemplary method 600 includes a sense or read function that is performed on the cells after each erase pulse, to determine if all the cells of the array 302 have yet achieved a threshold voltage Vt associated with an erased state (have been erased). FIGS. 7A-7E will further illustrate waveform timings associated with the exemplary method.

For example, the erase method 600 begins at 602, wherein a sector (or wordline) of flash memory 302 is provided, and initial condition values are established. In this example, the initial condition may include a gate pulse counter initialized to a zero count, and a time initialized at time $t_0$, for example, of the waveform timings of FIGS. 7A and 7B.

Figure 7A:
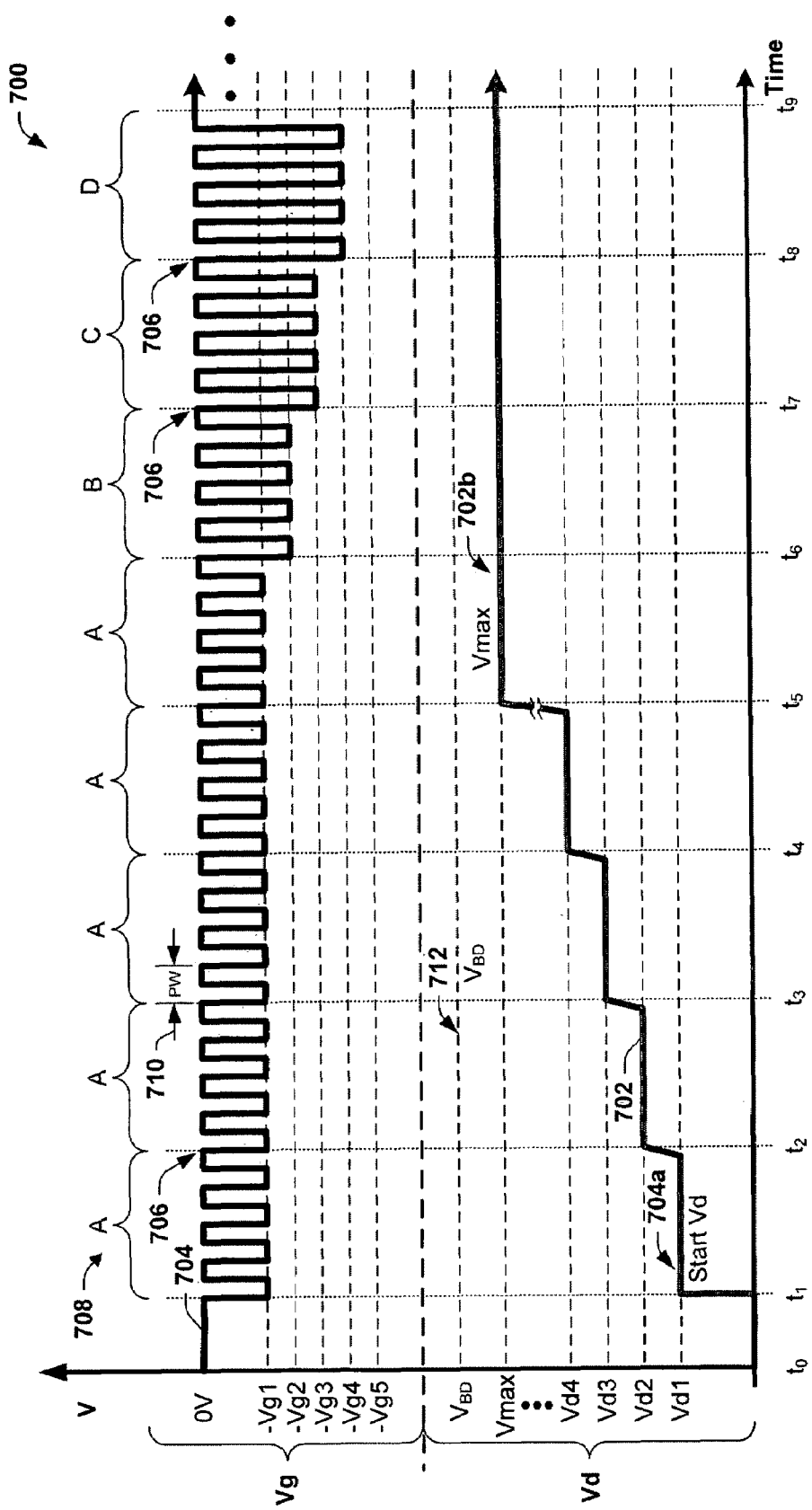
FIGS. 7A-7E are plots of exemplary drain and gate voltage pattern profiles as may be used to generate dynamic gate and drain voltages to erase a sector or a wordline of flash memory cells such as those depicted by FIGS. 1-3 using the patterned erase algorithm of the present invention of FIGS. 6A and 6B.
Figure 7B:
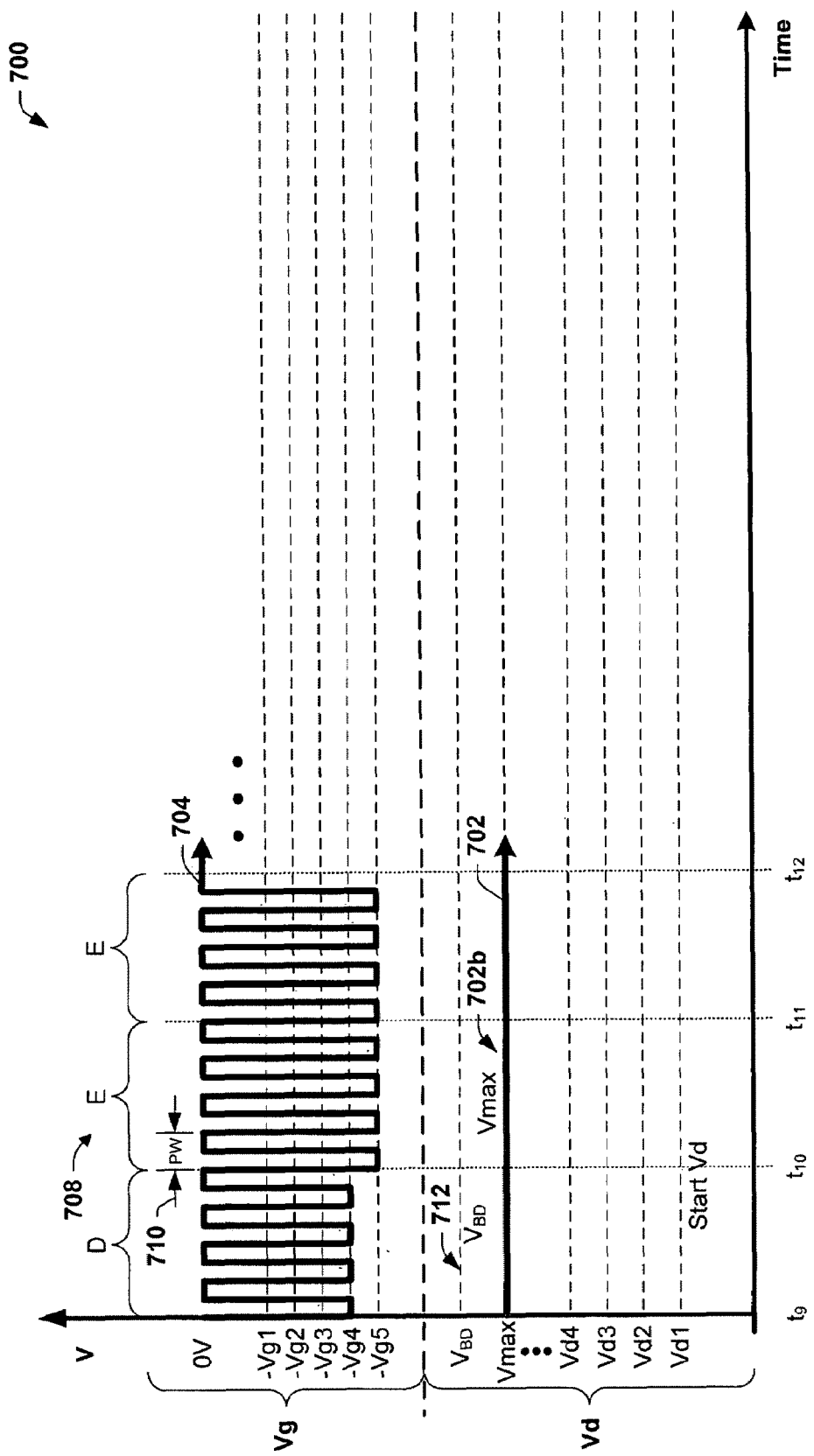

At 610, (e.g., at time $t_1$ of FIG. 7A) a stepped drain voltage pattern (e.g., stepped waveform Vd pattern 702 of FIGS. 7A and 7B) is applied to the drains of the sector of cells of the flash memory array (e.g., 302 of FIG. 3), the drain pattern (e.g., Vd pattern 702 of FIGS. 7A and 7B) starting at a start drain voltage (e.g., Vd1 of Vd pattern 702 of FIGS. 7A and 7B, about 5.5 volts). The drain voltage pattern (e.g., Vd pattern 702 of FIGS. 7A and 7B) may be provided to the drains by a patterned pulse erase bias arrangement (e.g., 310 of FIG. 3), by way of a column decoder (e.g., 340 of FIG. 3).

At 620, (e.g., also at time $t_1$ of FIG. 7A) a pulsed gate voltage pattern (e.g., pulsed waveform Vg pattern 704 of FIGS. 7A and 7B) is applied to the gates or wordline of the sector of cells of the flash memory array (e.g., 302 of FIG. 3), the gate pattern (e.g., Vg pattern 704 of FIGS. 7A and 7B) pulsing from about 0 volts to a first gate voltage (e.g., –Vg1 of Vg pattern 704 of FIGS. 7A and 7B). The gate pulse pattern (e.g., Vg pattern 704 of FIGS. 7A and 7B) may be provided to the gates by a patterned pulse erase bias arrangement (e.g., 310 of FIG. 3), by way of a row decoder (e.g., 330 of FIG. 3). The gate pulse pattern (e.g., Vg pattern 704 of FIGS. 7A and 7B) may comprise groups of pulses having up to a maximum number of gate pulses, for example, which may be identified as a "max count" 706 herein. The gate pulses may also be applied to one or more specific wordlines of specific cells by selecting cells that are to be erased to the same erased Vt level. For example, a word or another such group of 8, 16, 32, or higher bits per word may be erased by selection along a specific wordline. Thus, in one example, a word (e.g., of 8, 16, 32, or higher bits per word) of cell bit-pairs (e.g., dual sided ONO flash cells having two physical bits or complementary bits per cell) that are to be programmed and/or erased to the same pattern may be selected along a common wordline. The gate pulses of the gate pulse pattern (e.g., Vg pattern 704 of FIGS. 7A and 7B), may have a pulse period or pulse width (PW 710 of FIG. 7A) of about 100 us, for example.

At 622, after the first erase pulse, the cells of the flash array (e.g., 302 of FIG. 3) are sampled to see if all the cells are yet erased. If it is determined that all the cells are erased at 622, then the erase method ends at 624. If however, it is determined that all the cells are not erased at 622, then it is also determined whether the number of gate pulses has reached a maximum gate pulse count or max count 706 at 626.

If at 626, it is determined that the max count 706 has not been achieved, then the gate pulse count is incremented at 628 and another pulse is applied by way of the gate pulse pattern at 620, for example, by proceeding along the gate pulse pattern 704 to the next pulse in the current group. If, however, it is determined at 626 that the max count 706 has been achieved, then the gate pulse count is reset at 630, and another determination is made at 632 whether the stepped drain voltage pattern (e.g., Vd pattern 702 of FIGS. 7A and 7B) has been stepped up to and has achieved a maximum allowable drain voltage (e.g., Vmax 702b of FIGS. 7A and 7B). This maximum allowable drain voltage Vmax, for example, may comprise a drain voltage Vd that is slightly less than the breakdown voltage $V_{BD}$ (e.g., $V_{BD}$ 712 of FIGS. 7A and 7B) of the cells 302. In one embodiment of the present invention the maximum allowable drain voltage, Vmax may be represented as:

$V\text{max} = V_{BD} - 0.3\text{V}$

If at 632, it is determined that the maximum allowable drain voltage Vmax has not been achieved, then the Vd erase pattern (e.g., Vd pattern 702 of FIGS. 7A and 7B) is incremented up one step at 634 along the predetermined Vd pattern (e.g., as at times $t_2$ thru $t_5$ of FIG. 7A), and the method 600 continues along the Vd pattern at 610. However, if it is determined at 632 that the maximum allowable drain voltage Vmax has been achieved, then the pulsed gate voltage Vg pattern (e.g., Vg pattern 704 of FIGS. 7A and 7B) is incremented at 636 to the next gate pulse amplitude step along the pattern (e.g., as at times $t_6$ thru $t_{10}$, corresponding to gate erase pulse voltage increases in the Vg pattern 704 from –Vg1 to –Vg2, –Vg3, –Vg4, and –Vg5 of FIGS. 7A and 7B), and the method 600 continues along the Vg pattern at 620.

Thereafter, the method 600 continues along the Vg and Vd patterns, pulsing and increasing the Vg voltage while increasing the stepped Vd voltage up to Vmax and/or until all the cells of the array 302 are erased to a lower threshold voltage Vt at 624 and the method 600 ends. Thus, interactively erasing flash memory cells in this way essentially provides a narrowly defined erase threshold voltage Vt for the cells on that erased wordline (WL), or for all the cells of an erased sector or memory array 302.

Similar to the method 600 of FIG. 6A, FIG. 6B illustrates another method 660 of erasing a sector or wordline of memory cells (e.g., memory cell array 302 of FIG. 3) using drain voltage Vd and gate voltage Vg patterns, for example, similar to or different from those discussed in association with FIG. 6A. The method 660 of FIG. 6B includes a ramped drain voltage pattern (e.g., ramped waveform Vd pattern 722 of FIG. 7C) and a pulsed gate voltage pattern (e.g., pulsed waveform Vg pattern 724 of FIG. 7C) used to interactively erase memory bits of a sector or wordline in accordance with the present invention. As FIG. 6B is similar to that of FIG. 6A, FIG. 6B will not be discussed in its entirety for the sake of brevity except where noted.

Figure 7C:
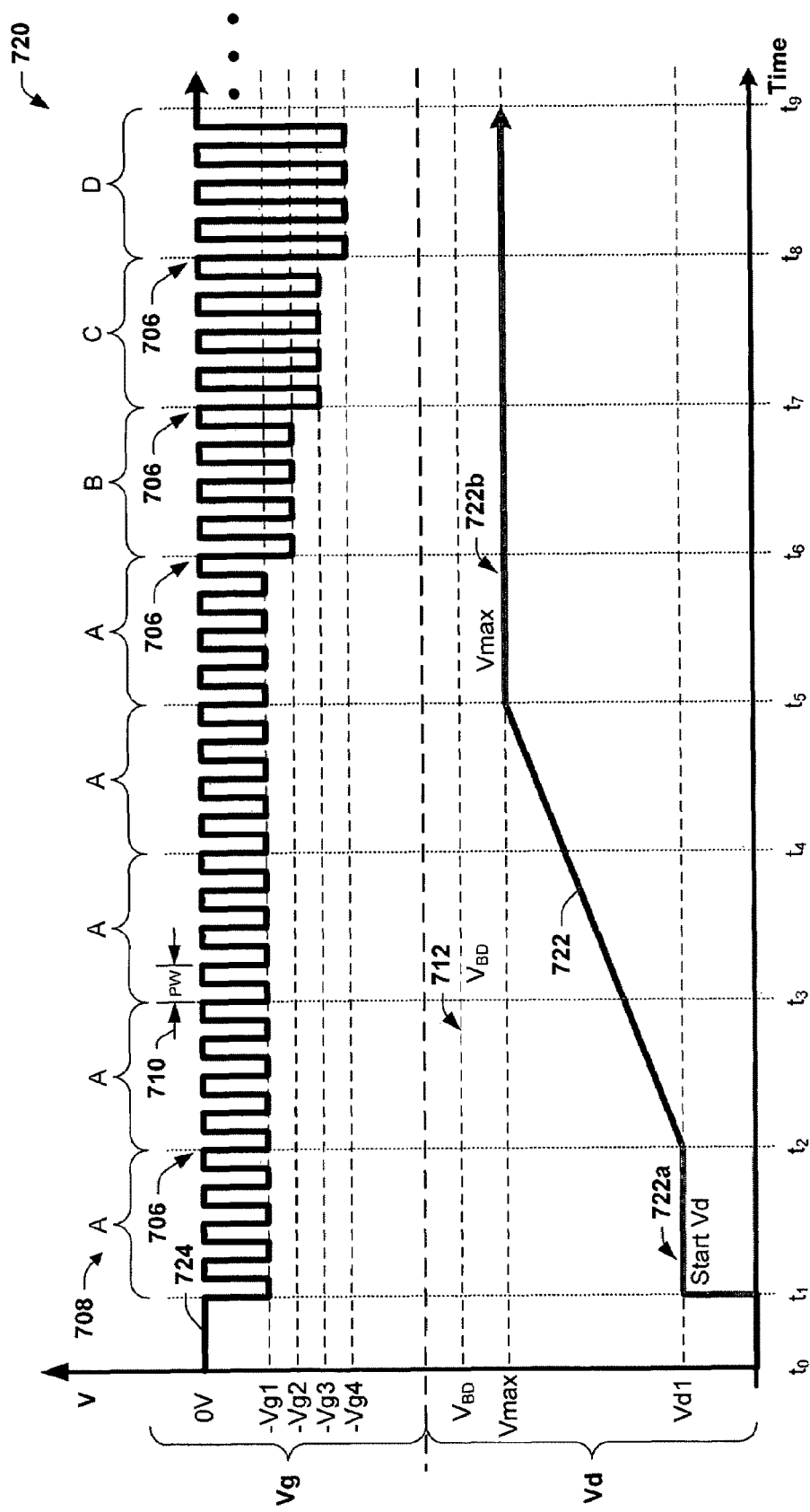

At 670 of method 660, (e.g., at time $t_1$ of FIG. 7C) a stepped drain voltage pattern (e.g., stepped waveform Vd pattern 722 of FIG. 7C) is applied to the drains of the sector of cells of the flash memory array (e.g., 302 of FIG. 3), the drain pattern (e.g., Vd pattern 722 of FIG. 7C) starting at a start drain voltage (e.g., Vd1 of Vd pattern 722 of FIG. 7C, about 5.5 volts). The drain voltage pattern (e.g., Vd pattern 722 of FIG. 7C) may be provided to the drains by a patterned pulse erase bias arrangement (e.g., 310 of FIG. 3), by way of a column decoder (e.g., 340 of FIG. 3).

If at 632, it is determined that the maximum allowable drain voltage Vmax has not been achieved, then the Vd erase pattern (e.g., Vd pattern 722 of FIG. 7C) is increased up one step at 674 along the predetermined Vd pattern (e.g., as at times $t_2$ thru $t_5$ of FIG. 7C), and the method 660 continues along the Vd pattern at 670. However, if it is determined at 632 that the maximum allowable drain voltage Vmax has been achieved, then the pulsed gate voltage Vg pattern (e.g., Vg pattern 724 of FIG. 7C) is incremented at 636 to the next gate pulse amplitude step along the pattern (e.g., as at times $t_6$ thru $t_{10}$, corresponding to gate erase pulse voltage increases in the Vg pattern 724 from –Vg1 to –Vg2, –Vg3, –Vg4, or –Vg5 of FIG. 7C), and the method 660 continues along the Vg pattern at 620.

Thereafter, the method 660 continues along the Vg and Vd patterns, pulsing and increasing the Vg voltage while increasing the ramped Vd voltage up to Vmax and/or until all the cells of the array 302 are erased to a lower threshold voltage Vt at 624 and the method 660 ends. Interactively erasing flash memory cells in this way essentially provides a narrowly defined erase threshold voltage Vt for the cells on that erased wordline (WL), or for all the cells of an erased sector or memory array 302. Thereafter the flash erasing method 660 of the present invention ends, wherein another sector or another word grouping of memory cells may be erased using the erase patterns.

Although a stepped and ramped drain voltage Vd pattern and a pulsed gate erase voltage Vg pattern has been illustrated and described herein, it will be appreciated in the context of the present invention that other such Vd and Vg patterns may be utilized in accordance with the methods of the present invention. For example, consider the Vd and Vg patterns illustrated in FIGS. 7A-7E.

FIGS. 7A-7E illustrate exemplary plots of drain and gate voltage patterns or profiles such as may be used to generate dynamic or interactive gate and drain voltages for erasing a sector or a wordline of flash memory cells such as those depicted by FIGS. 1-3 using the patterned erase algorithm and method of the present invention of FIGS. 6A and 6B.

For example, FIGS. 7A and 7B illustrate a stepped drain voltage Vd pattern 702, which may be applied to the drains of the cells of a flash memory array such as flash memory array 302 of flash memory device 300 of FIG. 3. The stepped drain voltage Vd pattern 702 may be provided by the patterned pulse erase bias arrangement 310 of FIG. 3, for example, and applied via column decoder 340 to the bitlines and drains of the cells of the array 302. When the stepped drain voltage Vd pattern 702 is generated by the patterned pulse erase bias arrangement 310 for erase operations, the Vd pattern 702 initializes at time $t_1$ by stepping or increasing to a start Vd voltage of Vd1 702a, for example, of about 5.5 volts, or some other predetermined starting voltage Vd1.

At this same time, $t_1$, the pulsed gate voltage Vg pattern 704 is applied to the gates of the cells of a flash memory array such as flash memory array 302 of flash memory device 300 of FIG. 3. The pulsed gate voltage Vg pattern 704 may be provided by the patterned pulse erase bias arrangement 310 of FIG. 3, for example, and applied via row decoder 330 to the wordlines and gates of the cells of the array 302. Again, the gate pulses of the pulsed gate voltage Vg pattern (e.g., Vg pattern 704 of FIGS. 7A and 7B), may have a pulse period or pulse width (e.g., PW 710 of FIG. 7A) of about 100 us, for example. As discussed above, after each gate voltage Vg pulse of Vg pattern 704, the array is sampled to determine if all the cells are yet erased. If the cells are all erased at this point, the method ends, otherwise, the gate voltage pulsing and drain voltage patterns continue.

Between times $t_1$ and $t_2$, one or more such gate voltage pulses of pulse width PW 710, may be applied as shown, for example, a group A 708 of four gate voltage Vg pulses are shown as being applied to the gates for each drain voltage Vd step. While the cells of the array remain unerased, and after the first group A 708 of four, or a max count 706 is achieved, wherein the exemplary gate voltage pulses are applied to the sector or wordline of the array (e.g., 302 of FIG. 3), other groups (e.g., A, B, C, D, E . . . 708) of gate pulses of pulse width PW 710 (e.g., about 150 ns-200 µs, or about 100 µs) and max count 706, may be applied to the array at times $t_2$ thru $t_5$ of FIG. 7A, for example, while the method (e.g., methods 600 and 660 of FIGS. 6A and 6B) continues along the Vd pattern 702 (e.g., Vd steps Vd1, Vd2, Vd3, Vd4 . . . Vmax 702b), and Vg pattern 704. Again, Vmax may equal some Vd voltage less than the breakdown voltage $V_{BD}$, for example, Vmax=$V_{BD}$–Vx, where Vx may be about 0.3 volts.

After the Vd pattern 702 achieves a predetermined Vd voltage maximum Vmax 702b, between times $t_6$ thru $t_{10}$, the pulsed gate erase voltage Vg pattern 724 continues to increase from –Vg1 to –Vg2, –Vg3, –Vg4, or –Vg5 of FIG. 7C, while the method (e.g., methods 600 and 660 of FIGS. 6A and 6B) continues along the Vd pattern 702 at Vmax 702b of FIGS. 7A and 7B. This Vg pulsing activity, up to a maximum pulse count of max count 706, then continues increasing along the Vg pattern 704 until a maximum gate voltage Vg is achieved, for example, –Vg5. After this maximum gate voltage –Vg5 is achieved, the amplitude of the gate pulses remains at –Vg5 until all the cells of the sector or array (e.g., 302 of FIG. 3) are erased.

Similarly, FIG. 7C illustrates an exemplary plot 720 of a ramped drain voltage Vd pattern 722, and a pulsed gate voltage Vg pattern 724, and as such need not be completely described again for the sake of brevity. By contrast to the stepped Vd pattern 702 of FIGS. 7A and 7B, the ramped drain voltage Vd pattern 722 of FIG. 7C continuously increases along the pattern 722 while the Vg pulsing continues along Vg pattern 724 in groups of up to a maximum pulse count of max count 706, for example. Again, the drain voltage Vd starts at a start Vd 722a, for example, at a Vd1 level, and the drain voltage Vd may be limited to a safe Vd voltage maximum of Vmax 722b. The gate voltage pattern is illustrated as substantially the same in FIGS. 7A/7B as in FIG. 7C, wherein the pulse width is illustrated as PW 710 of about 100 us, for example.

Figure 7D:
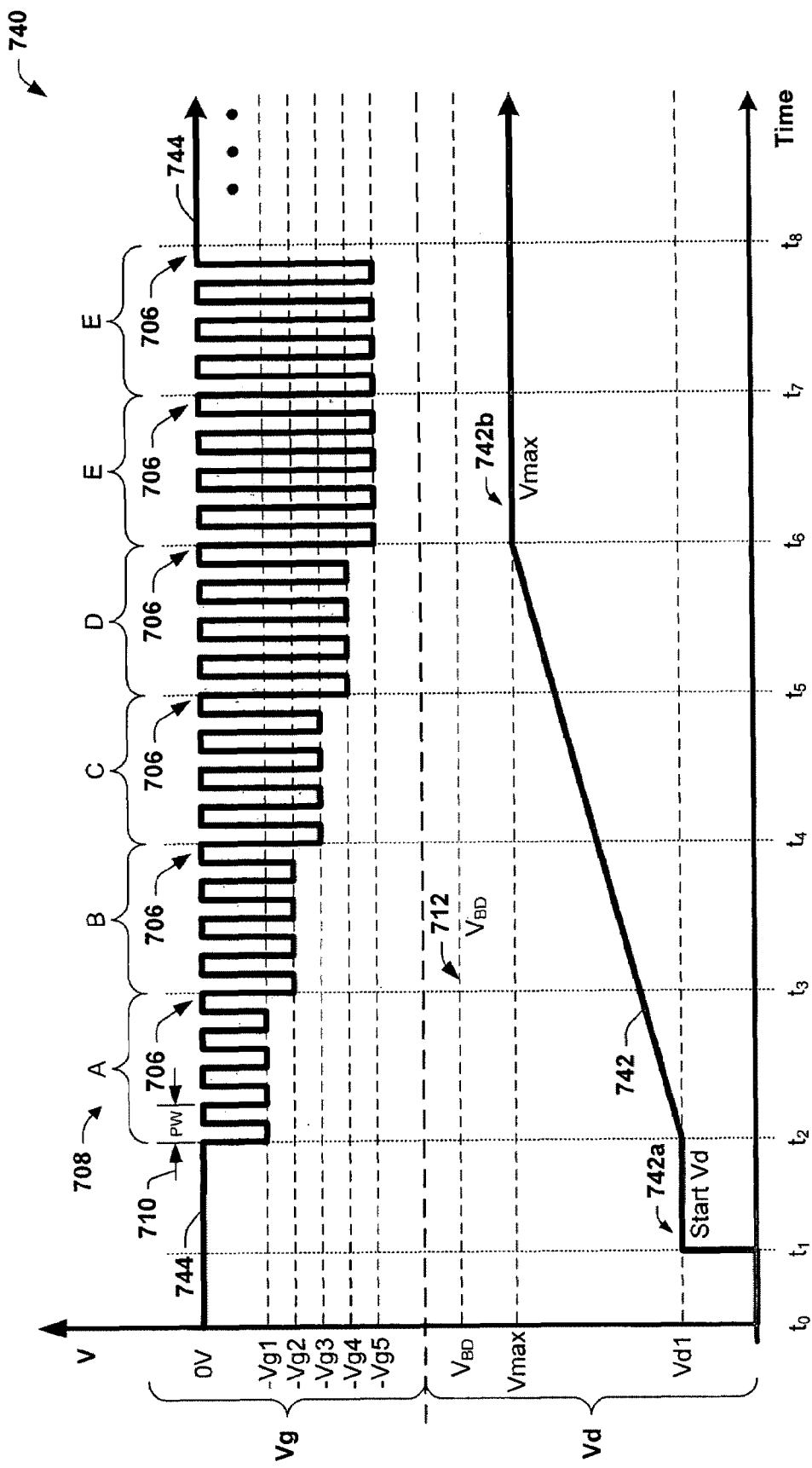

FIG. 7D also illustrates an exemplary plot 740 having a ramped drain voltage Vd pattern 742, and a pulsed gate voltage Vg pattern 744. The drain voltage Vd pattern 742 is again similar to that of ramped drain voltage Vd pattern 722, and as such need not be completely described again for the sake of brevity. The pulsed gate voltage Vg pattern 744 of FIG. 7D further illustrates a variation on the pulsed gate voltage Vg patterns 704 and 724. For example, the groups 708 of gate pulses (e.g., having pulse width PW 710 of about 150 ns-200 µs, or about 100 µs pulsewidth) may be patterned to increase in voltage every new group 708 of up to a maximum pulse count of max count 706, for example, until the maximum drain voltage Vmax 742b is achieved, whereupon the amplitude of the gate pulsing holds at a maximum safe Vg level of –Vg5, for example.

Figure 7E:
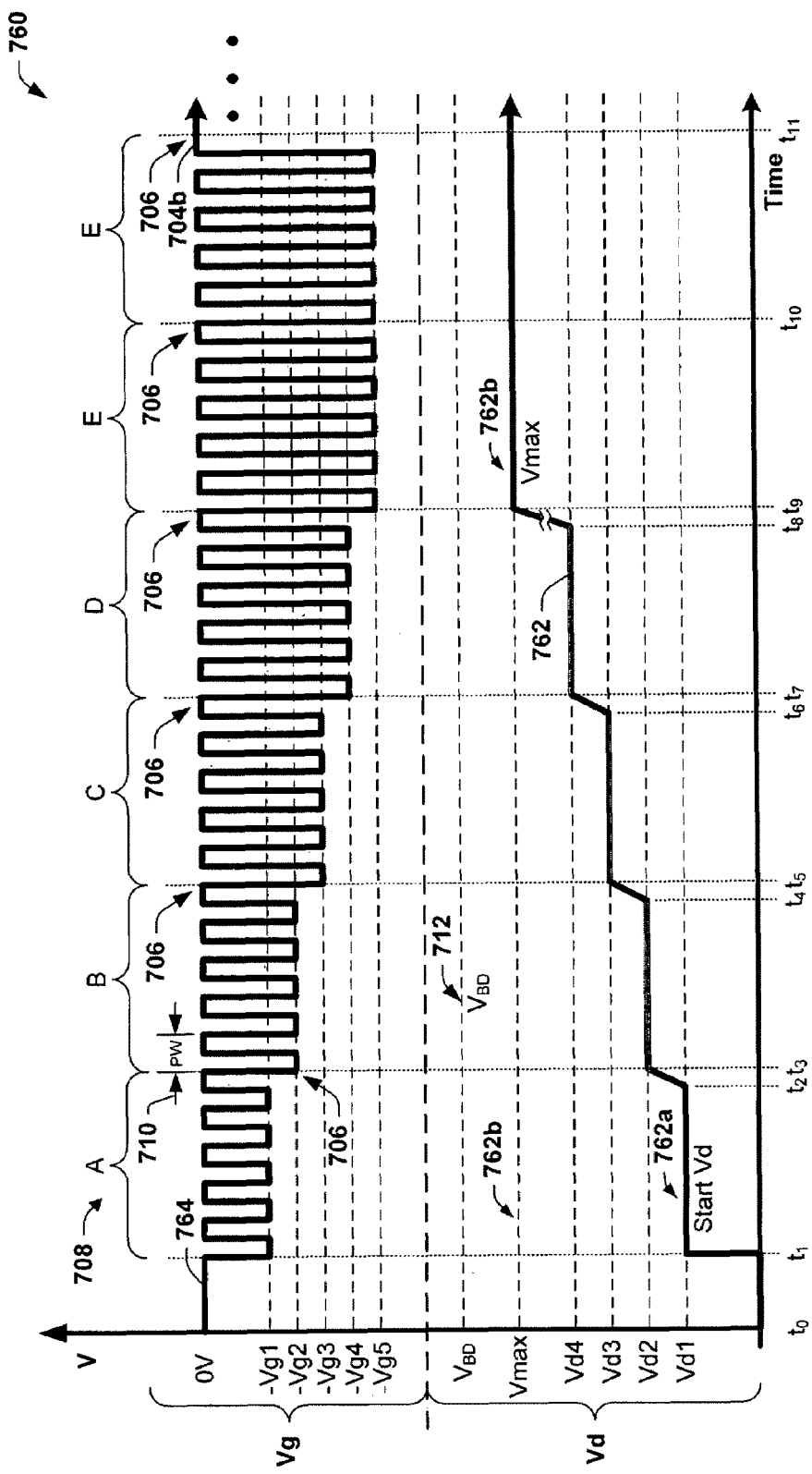

FIG. 7E also illustrates an exemplary plot 760 having a ramp and step drain voltage Vd pattern 762, and a pulsed gate voltage Vg pattern 764. The pulsed gate voltage Vg pattern 764 is again similar to that of the pulsed gate voltage Vg pattern 744 of FIG. 7D, and as such need not be completely described again for the sake of brevity. The ramp and step drain voltage Vd pattern 762 of FIG. 7E further illustrates a combination of the stepped drain voltage Vd pattern 702 of FIGS. 7A and 7B, and the ramped drain voltage Vd patterns 742 of FIG. 7D, for example. For example, during the first group A 708 of gate pulses, the drain voltage holds at a Vd1 step level, then when the first gate pulse group A 708 ends, the drain voltage ramps up to a second drain voltage Vd2 step level and again holds. This drain voltage Vd pattern continues ramping and holding at Vd3 and Vd4 with every new pulse group 708, for example, up to a maximum pulse count of max count 706, until the maximum drain voltage Vmax 762b is achieved and holds at this level. At Vmax 762b, the amplitude of the gate pulsing then holds at a maximum safe Vg level of −Vg5, for example.

Other such erase patterns are anticipated in the context of the present invention, including Vd and/or Vg voltage, pulse width, step amplitude, and ramp slope variations, including variations of timing synchronization or non-synchronization between the Vd and Vg patterns. Further, various $V_{DD}$ and $V_{SS}$ supply bias levels are anticipated in the context of the present invention.

Although a drain voltage pattern and a pulsed gate voltage pattern are illustrated and described herein, it will be appreciated that a drain voltage of a drain voltage pattern and a gate voltage or gate voltage pulse of the pulsed gate voltage pattern may be applied to the flash memory cells of the memory array, and that at any instant of time along the progression of the drain and gate voltage patterns that a single voltage is applied to the drain and gate, respectively. Further, it will be appreciated in the context of the present invention that the first gate pulse and drain voltage, or any other subsequent gate pulse and drain voltage of the gate and drain patterns, may result in the complete erasure of a selected cell, a wordline, a sector, or the entire array of memory cells, and as such the gate and drain voltages which have occurred up to that same time of complete erasure along the progression of the patterns constitutes the gate and drain patterns as described herein, and thereafter the erase method terminates and the gate and drain patterns also end.

Figure 8:
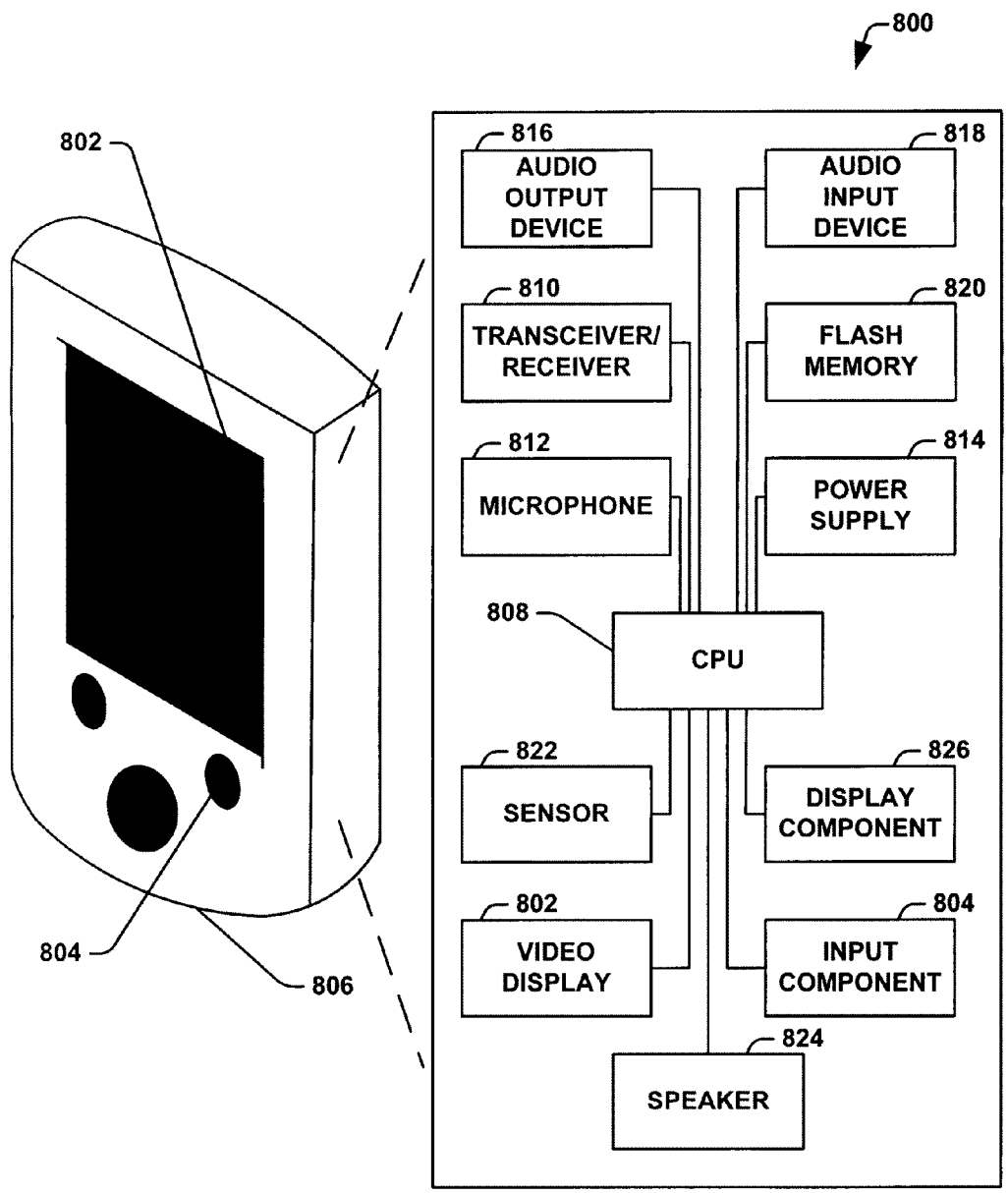
FIG. 8 is an isometric view of an electronic device and block diagram, wherein an erase bias circuit may be utilized according to other aspects of the present invention.

FIG. 8 illustrates an example of a (portable) electronic device, such as a communications device or Personal Data Assistant (PDA) 800, for example, where one or more aspects of the disclosure herein may be implemented. The communication device 800 comprises a video display 802, one or more user input components 804, a housing 806, a CPU 808, a transceiver and/or receiver 810, a microphone 812, a power supply 814, an audio output device 816, an audio input 818, a memory 820, various sensors 822, and speaker(s) 824. The memory 820 of the communication device 800 may comprise, for example, an erase bias circuit as described herein. The one or more user input components 804 can include a keypad, buttons, dials, pressure keys, and the like. The video display 802 can be a liquid crystal display, a plasma display, an LED display, and the like, for visually displaying information. The CPU 808 can be configured to communicate with the audio input device 818, the audio output device 816 and a display component 826. The display component 826 can be separate and distinct from the video display 802. The CPU 808 can execute control functions based on inputs from the user, entered using the one or more user input components 804, for example. Based on those inputs, for example the display component can display a graph, a photo, a map, a chart, a video, and the like.

The communication device 800 can also be configured to output data as an audio signal, for example a song, a message, a warning sound, various tones, recordings, etc. The communication device 800 can be configured to communicate with other electronic devices, for example computers, cell phones, other PDAs, and the like. The communication device 800 can also be configured to (wirelessly) transmit and/or receive data. This is done utilizing the transmitter/receiver 810 to either transmit or receive data. Additionally, sensors 822 can be utilized to sense data external to the PDA 800, for example, temperatures, radiation levels, pressures, and the like. It will be appreciated that an erase bias circuit comprising a patterned pulse erase bias arrangement operable to apply a stepped or ramped drain voltage pattern and a pulsed gate voltage pattern to the memory cells of a flash memory device described herein can similarly be implemented in cell phones, memory sticks, flash drive devices, video camcorders, voice recorders, USB flash drives, fax machines, flash memory laptops, MP3 players, digital cameras, home video game consoles, hard drives, memory cards (used as solid-state disks in laptops), and the like.

Figure 9A:
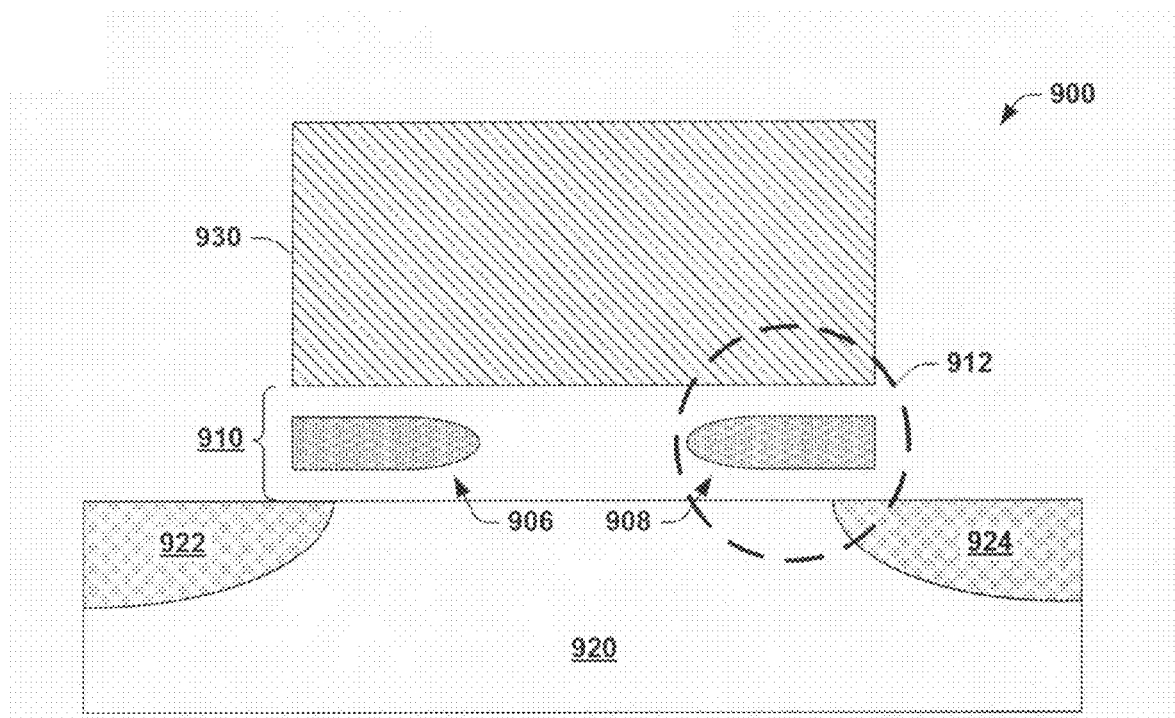
FIGS. 9A-9C are cross-sectional views of under-cut ORO (oxide-nitride poly-oxide) and ORPRO (oxide-nitride poly-poly-nitride poly-oxide), respectively, flash memory cells having two storage bits, such as may be used in accordance the methods of the present invention.
Figure 9B:
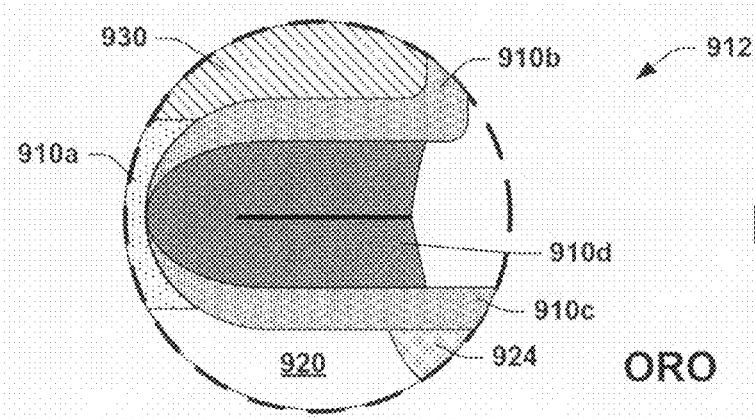
Figure 9C:
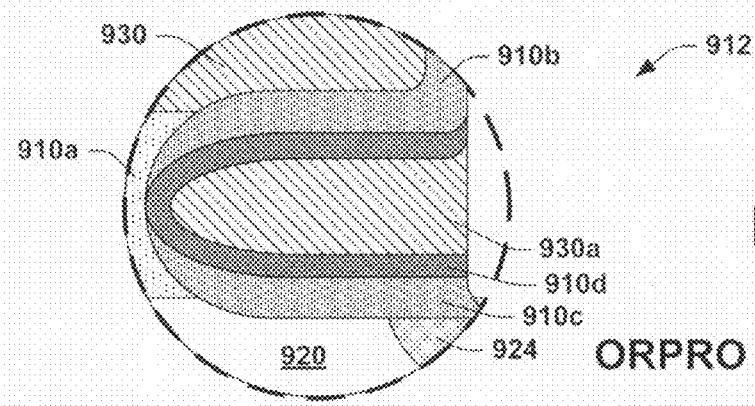

FIGS. 9A-9C illustrate under-cut ORO (oxide-nitride poly-oxide) and ORPRO (oxide-nitride poly-poly-nitride poly-oxide), respectively, flash memory cells 900 having two storage bits, such as may be used in accordance the erase methods of the present invention utilizing high erase bias levels to improve erase cycling speed and reliability while maintaining highly compact Vt distributions.

For example, flash memory cell 900 of FIG. 9A illustrates under-cut regions 906 and 908 formed in storage region 910, formed overlying substrate 920, wherein a source region 922 or a drain region 924 has been implanted. Flash memory cell 900 further comprises a gate poly layer 930 formed overlying the storage region 910, the storage region comprising two storage bits 906 and 908 per cell 900, for example. Flash memory cell 900 also comprises, under the gate poly layer 930, an under-cut region 912, which may be implemented in the ORO or ORPRO flash memory cell 900 configurations.

FIG. 9B further illustrates details of the under-cut region 912 using the ORO (oxide-nitride poly-oxide) configuration or type under-cut flash memory cell 900. The ORO under-cut configuration comprises a gate oxide layer (GOX) 910a between the substrate 920 and the gate polysilicon layer (Poly) 930, into which is formed or undercut, a Top OX (Top Oxide) layer 910b and a TOX (tunnel oxide) layer 910c, into which is formed an SiRN (polysilicon rich Nitride) layer 910d, thereby forming a three layer stack in the undercut storage region 912. The ORO flash memory cell 900 has a first or left undercut bit 906 on the source region side 922, and a second or right undercut bit 908 on the drain region side 924, for example.

FIG. 9C further illustrates details of the under-cut region 912 using the ORPRO (oxide-nitride poly-poly-nitride poly-oxide) configuration or type under-cut flash memory cell 900. The ORPRO under-cut configuration comprises a gate oxide layer (GOX) 910a between the substrate 920 and the gate polysilicon layer (Poly) 930, into which is formed or undercut, a Top OX layer 910b and a TOX layer 910c, into which is formed a SiRN layer 910d, and an additional undercut polysilicon region 930a, thereby forming a five layer stack in the undercut storage region 912. The ORPRO flash memory cell 900 also comprises a first or left undercut bit 906 on the source region side 922, and a second or right undercut bit 908 on the drain region side 924, for example.

Figure 10:
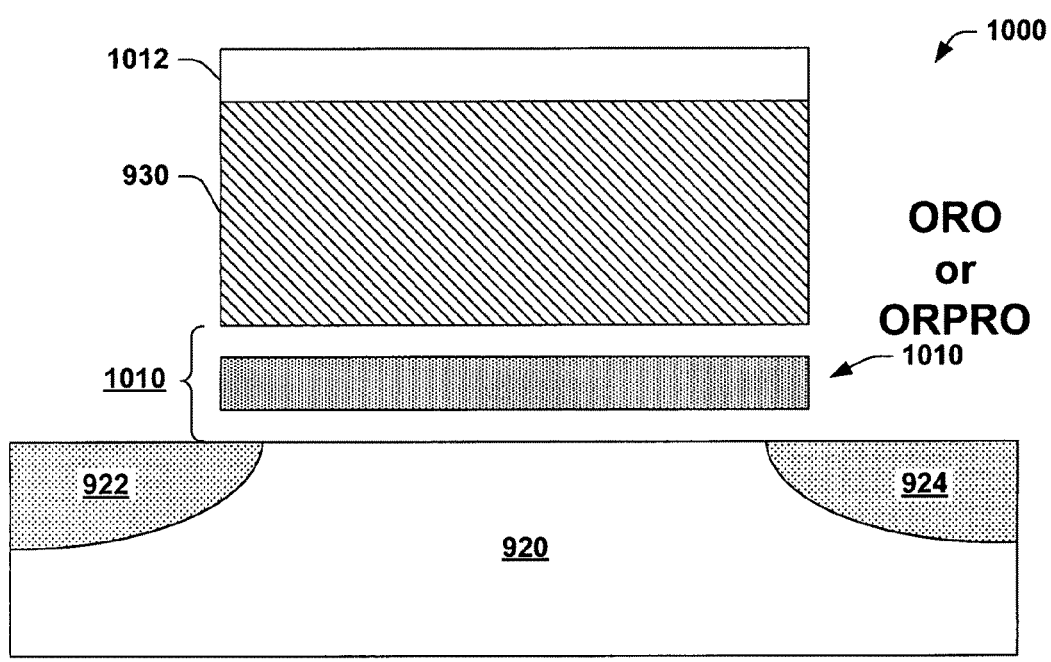
FIG. 10 is a cross-sectional view representing a planar ONO, ORO, or ORPRO flash memory cell, such as may be used in accordance the methods of the present invention.

FIG. 10 is a cross-sectional view representing a planar ORO (oxide-nitride poly-oxide) or ORPRO (oxide-nitride poly-poly-nitride poly-oxide) flash memory cell 1000, such as may be used in accordance the erase methods of the present invention utilizing high erase bias levels to improve erase cycling speed and reliability while maintaining highly compact Vt distributions.

For example, flash memory cell 1000 of FIG. 10 illustrates ORO or ORPRO storage region 1010, formed overlying substrate 920, wherein a source region 922 or a drain region 924 has been implanted. Flash memory cell 1000 further comprises a gate poly layer 930 and an oxide layer 1012 formed overlying the storage region 1010 comprising one or more storage bits and/or multiple storage levels per cell 1000, for example. Flash memory cell 1000 may further comprise within the ORO or ORPRO storage region 1010, layers formed in a planar fashion similar to the ORO or ORPRO layers described above for flash memory cell 900 of FIGS. 9A-9C.

For example, if the storage region 1010 of FIG. 10 represents an ORO planar flash memory cell configuration, the three layers represented and discussed in FIG. 9B would be used: Top OX (Top Oxide) layer 910b, TOX (tunnel oxide) layer 910c, and an R(SiRN) (polysilicon rich Nitride) layer 910d. If, for example, the storage region 1010 represents an ORPRO planar flash memory cell configuration, the five layers represented and discussed in FIG. 9B would be used: Top OX layer 910b, TOX layer 910c, an upper and lower SiRN layer 910d formed above and below the polysilicon region layer 930a.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of erasing a flash memory cell, the method comprising the steps of:
  a) applying a drain voltage pattern to a drain of the memory cell, wherein the drain voltage pattern comprises a time-varying drain voltage following a first predetermined pattern, and wherein the amplitude of the drain voltage varies continuously, non-continuously, or a combination thereof over time; and
  b) applying a pulsed gate voltage pattern to a gate of the memory cell until a predetermined number of gate pulses is achieved or until the memory cell generally corresponds to an erased state, wherein the pulsed gate voltage pattern comprises a time-varying pulsed gate voltage following a second predetermined pattern of pulses, and wherein the amplitude of the pulsed gate voltage varies continuously, non-continuously, or a combination thereof over time.

2. The method of claim 1, wherein applying the drain voltage pattern comprises applying the drain voltage of the drain voltage pattern.

3. The method of claim 2, wherein applying the pulsed gate voltage pattern comprises applying a gate voltage pulse of the pulsed gate voltage pattern.

4. The method of claim 3, further comprising:
  c) increasing the voltage along the drain voltage pattern to an incrementally greater drain voltage or until a maximum drain voltage is achieved and maintaining the maximum drain voltage until the memory cell generally correspond to the erased state;
  d) repeating steps a, b and c until the maximum drain voltage and the predetermined number of gate pulses is achieved or until the memory cell generally correspond to the erased state;
  e) increasing the voltage along the pulsed gate voltage pattern to an incrementally greater gate voltage or until a maximum pulsed gate voltage is achieved and maintaining the maximum pulsed gate voltage until the memory cell generally correspond to the erased state; and
  f) repeating step e until the memory cell generally correspond to the erased state.

5. The method of claim 4, wherein increasing the voltage along the drain voltage pattern to an incrementally greater drain voltage comprises ramping the drain voltage at a predetermined slope rate along the drain voltage pattern.

6. The method of claim 4, wherein the drain voltage pattern comprises a stepped drain voltage pattern and wherein increasing the voltage along the drain voltage pattern comprises increasing the drain voltage along the stepped drain voltage pattern by a predetermined value per step of the stepped drain voltage pattern.

7. The method of claim 6, wherein the stepped drain voltage pattern further comprises ramped portions between the steps of the stepped drain voltage pattern.

8. The method of claim 4, wherein the maximum drain voltage is about 0.3 volts lower than the breakdown voltage VBD of the flash memory cell, which may also be represented as Vmax=about VBD−0.3V.

9. The method of claim 4, wherein the maximum pulsed gate voltage is between about −5.5 volts and about −8.0 volts.

10. The method of claim 1, further comprising erasing a sector of flash memory cells.

11. The method of claim 1, wherein the memory cell is operable to maintain one of a first and second data state.

12. The method of claim 1, wherein the flash memory cell comprises a multi-level flash memory cell.

13. The method of claim 1, wherein the pulsed gate voltage pattern initially begins pulsing the gate of the memory cell with a pulse amplitude that is at least a charge trap voltage level of the memory cell.

14. The method of claim 1, wherein the flash memory cell comprises one of a dual sided ONO flash memory cell having three or more data levels per bit, an undercut ORO or ORPRO flash memory cell, and a planar ORO or ORPRO flash memory cell.

15. The method of claim 14, further comprising alternately applying the erase pulses to each bit of the memory cell in order to obtain improved CBD control.

16. The method of claim 1, wherein the pulsed gate voltage pattern and the drain voltage pattern comprise predetermined erase voltage patterns that are applied to the cell over successive erase pulses.

17. The method of claim 16, wherein the predetermined erase voltage patterns further vary one of the drain voltage, the gate voltage, and a combination of the drain and gate voltages from an initial drain voltage and an initial gate voltage applied to the memory cell.

18. The method of claim 16, wherein the predetermined erase voltage patterns are determined by a look-up table corresponding to the desired erase pattern.

19. The method of claim 16, wherein one of the drain voltage and the gate voltage is held constant while the other of the voltages follows the predetermined erase voltage pattern.

20. The method of claim 1, wherein the drain voltage pattern further comprises a starting drain voltage, a maximum drain voltage, and a predetermined number of gate pulses for the duration of the ramping portion of a drain voltage pattern.

21. The method of claim 20, wherein the drain voltage pattern comprises a stepped drain voltage pattern having one or more voltage steps between an initial start drain voltage and the maximum drain voltage.

22. The method of claim 21, wherein the pulsed gate voltage pattern comprises a predetermined number of pulses for each step of the stepped drain voltage pattern.

23. The method of claim 1, wherein the pulsed gate voltage pattern comprises successive groups of erase pulses that change by about 50 mV to about 200 mV per group or per pulse.

24. The method of claim 1, wherein the pulsed gate voltage pattern comprises an erase pulse width of about 150 ns-200 μs width.

25. The method of claim 1, wherein the pulsed gate voltage pattern comprises a group of gate pulses, and wherein the amplitude of the gate pulses increases in a voltage pattern that is synchronized with the drain voltage pattern.

26. The method of claim 1, wherein the pulsed gate voltage pattern comprises a group of gate pulses, and wherein the amplitude of the gate pulses increases in a voltage pattern that is synchronized with each step of the drain voltage pattern.

27. The method of claim 1, further comprising deselecting an erased memory cell before applying additional gate pulses of the pulsed gate voltage pattern to additional memory cells.

28. The method of claim 1, wherein the start of one of the pulsed gate voltage pattern and the drain voltage pattern is offset from the other of the pulsed gate voltage pattern and the drain voltage pattern.

29. An erase bias circuit for rapidly erasing a sector of flash memory cells of an array of flash memory cells, comprising:
the sector of flash memory cells each having a floating gate and a drain, the cells operable to maintain one of a programmed data state and an erased state;
a row decoder configured to select wordline rows of cells, the rows associated with the gates of the flash memory cells, and a column decoder configured to select columns of cells, the columns associated with the drains of the flash memory cells;
a supply bias arrangement configured to provide a source supply voltage and a drain supply voltage to the sector of flash memory cells to bias the cells for program and erase memory operations; and
a patterned pulse erase bias arrangement configured to provide a pulsed gate voltage pattern to the gates of the cells as selected by the row decoder, and to provide a drain voltage pattern to the drains of the cells as selected by the column decoder, wherein the pulsed gate voltage pattern and the drain voltage pattern applied to the sector of flash memory cells is operable to provide high erase bias levels for rapidly erasing the sector of flash memory cells, whereby the cycling reliability of the cells may be improved, wherein the drain voltage pattern comprises a time-varying drain voltage following a first predetermined pattern, and wherein the pulsed gate voltage pattern comprises a time-varying pulsed gate voltage following a second predetermined pattern of pulses.

30. The erase bias circuit of claim 29, wherein the drain voltage pattern comprises a stepped drain voltage operable to supply an initial drain voltage and a maximum drain voltage which is less than the breakdown voltage of the cells, and one or more intermediate voltages between the initial drain voltage and the maximum drain voltage.

31. The erase bias circuit of claim 29, wherein the drain voltage pattern comprises a ramped drain voltage pattern-operable to supply an initial drain voltage and a maximum drain voltage which is less than the breakdown voltage of the cells, and a continuously increasing ramp voltage between the initial drain voltage and the maximum drain voltage.

32. An electronic device, comprising:
a user input configured to allow a user to input data;
a user output configured to output data to the user;
a central processing unit (CPU) operatively coupled to the user input and the user output and configured to receive and process the user input and to output the user output; and
a memory operatively coupled to the CPU and configured to receive data from and send data to the CPU, the memory comprising an erase bias circuit configured to interactively apply a stepped or ramped drain voltage pattern to a drain of the memory cells of the memory and a pulsed gate voltage pattern to a gate of the memory cells for a predetermined number of gate pulses or until all the memory cells of a sector achieve an erased state, the erase bias circuit comprising row and column decoders that selects wordline rows and columns of cells, respectively, a supply bias arrangement that provides source and drain supply voltages for the sector, and a patterned pulse erase bias arrangement configured to provide the pulsed gate voltage pattern to the gates of the cells as selected by the row decoder, and to provide the drain voltage pattern to the drains of the cells as selected by the column decoder, wherein the stepped or ramped drain voltage pattern comprises a time-varying drain voltage following a first predetermined pattern, and wherein the pulsed gate voltage pattern comprises a time-varying pulsed gate voltage following a second predetermined pattern of pulses.

33. The device of claim 32, wherein:
the sector comprises flash memory cells each having a floating gate and a drain, the cells operable to maintain one of a programmed data state and an erased state;
the row decoder is configured to select the wordline rows of cells, the rows associated with the gates of the flash memory cells, and the column decoder configured to select the columns of cells, the columns associated with the drains of the flash memory cells;
the supply bias arrangement is configured to provide the source supply voltage and the drain supply voltage to the sector of flash memory cells to bias the cells for program and erase memory operations; and
wherein the patterned pulse erase bias arrangement is configured to provide the pulsed gate voltage pattern and the drain voltage pattern to the sector of flash memory cells having high erase bias levels for rapidly erasing the sector of flash memory cells, whereby the cycling reliability of the cells may be improved.

34. The device of claim 32, wherein the electronic device comprising at least one of a communication device, Personal Data Assistant (PDA), cell phone, memory stick, flash drive device, video camcorder, voice recorder, USB flash drive, fax machine, flash memory, laptop, computer, scanner, MP3 player, digital camera, home video game console, hard drive and memory card.

\* \* \* \* \*